(12) United States Patent
Yamaguchi

(10) Patent No.: US 10,186,518 B2
(45) Date of Patent: Jan. 22, 2019

(54) METHOD OF MANUFACTURING SEMICONDUCTOR DEVICE

(71) Applicant: Renesas Electronics Corporation, Tokyo (JP)

(72) Inventor: Tadashi Yamaguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 33 days.

(21) Appl. No.: 15/602,448

(22) Filed: May 23, 2017

(65) Prior Publication Data
US 2018/0061849 A1    Mar. 1, 2018

(30) Foreign Application Priority Data

Aug. 25, 2016 (JP) .................. 2016-164586

(51) Int. Cl.
    *H01L 27/11568*    (2017.01)
    *H01L 21/768*    (2006.01)
    (Continued)

(52) U.S. Cl.
CPC .. *H01L 27/11568* (2013.01); *H01L 21/02123* (2013.01); *H01L 21/02126* (2013.01); *H01L 21/02129* (2013.01); *H01L 21/02164* (2013.01); *H01L 21/02216* (2013.01); *H01L 21/02263* (2013.01); *H01L 21/02337* (2013.01); *H01L 21/28282* (2013.01); *H01L 21/3105* (2013.01); *H01L 21/31053* (2013.01); *H01L 21/31055* (2013.01); *H01L 21/3212* (2013.01); *H01L 21/32134* (2013.01); *H01L 21/76801* (2013.01);
(Continued)

(58) Field of Classification Search
CPC ......... H01L 27/11531; H01L 21/76801; H01L 21/76802; H01L 21/76834; H01L 21/76814; H01L 21/76837; H01L 21/02126; H01L 21/02129; H01L 21/02164
See application file for complete search history.

(56) References Cited

U.S. PATENT DOCUMENTS 5,069,747 A * 12/1991 Cathey .............. H01L 21/02164
                                                            257/E21.038
2001/0023126 A1    9/2001 Kim
(Continued)

FOREIGN PATENT DOCUMENTS

JP      2001-244264 A    9/2001

*Primary Examiner* — Ermias Woldegeorgis
(74) *Attorney, Agent, or Firm* — Mattingly & Malur, PC

(57) ABSTRACT

Performance and reliability of a semiconductor device are improved. An insulating film is formed such that a control gate electrode, a memory gate electrode, and a gate electrode are embedded, and then tops of the control gate electrode, the memory gate electrode, and the gate electrode are exposed by first polishing. Subsequently, a trench is formed by removing the gate electrode and filled with a metal film, and second polishing is performed to form a gate electrode including the metal film. The insulating film is an $O_3$-TEOS film having a high gap filling characteristic, and thus reduces formation of a seam in the insulating film. Furthermore, the $O_3$-TEOS film is subjected to heat treatment in an oxidizing atmosphere before the first polishing, thereby dishing of the insulating film is reduced during the second polishing.

14 Claims, 23 Drawing Sheets

(51) Int. Cl.
*H01L 21/02* (2006.01)
*H01L 21/28* (2006.01)
*H01L 21/3105* (2006.01)
*H01L 21/321* (2006.01)
*H01L 21/3213* (2006.01)
*H01L 27/11573* (2017.01)
*H01L 29/06* (2006.01)
*H01L 29/423* (2006.01)
*H01L 29/45* (2006.01)
*H01L 29/78* (2006.01)
*H01L 29/66* (2006.01)
*H01L 29/49* (2006.01)
*H01L 29/51* (2006.01)

(52) U.S. Cl.
CPC .. *H01L 21/76802* (2013.01); *H01L 21/76814* (2013.01); *H01L 21/76837* (2013.01); *H01L 21/76877* (2013.01); *H01L 27/11573* (2013.01); *H01L 29/0649* (2013.01); *H01L 29/42344* (2013.01); *H01L 29/456* (2013.01); *H01L 29/66545* (2013.01); *H01L 29/66568* (2013.01); *H01L 29/785* (2013.01); *H01L 29/4966* (2013.01); *H01L 29/517* (2013.01); *H01L 29/665* (2013.01); *H01L 29/6659* (2013.01)

(56) References Cited

U.S. PATENT DOCUMENTS

| | | | |
|---|---|---|---|
| 2004/0161903 A1* | 8/2004 | Yuan | C23C 16/045 438/424 |
| 2008/0054374 A1* | 3/2008 | Mikasa | H01L 27/10876 257/401 |
| 2014/0227843 A1* | 8/2014 | Tsukamoto | H01L 21/28282 438/275 |

* cited by examiner

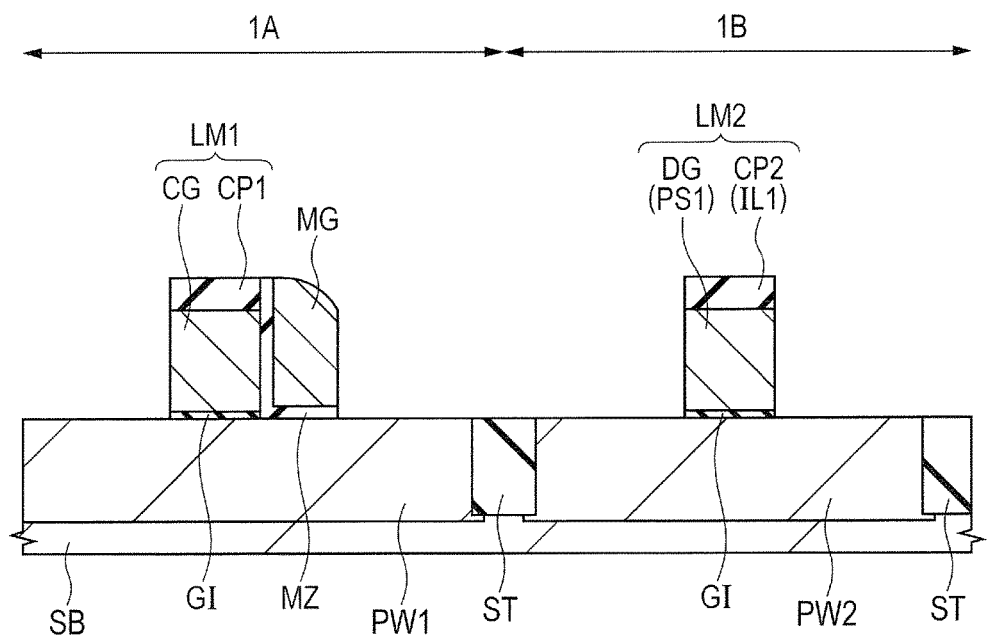
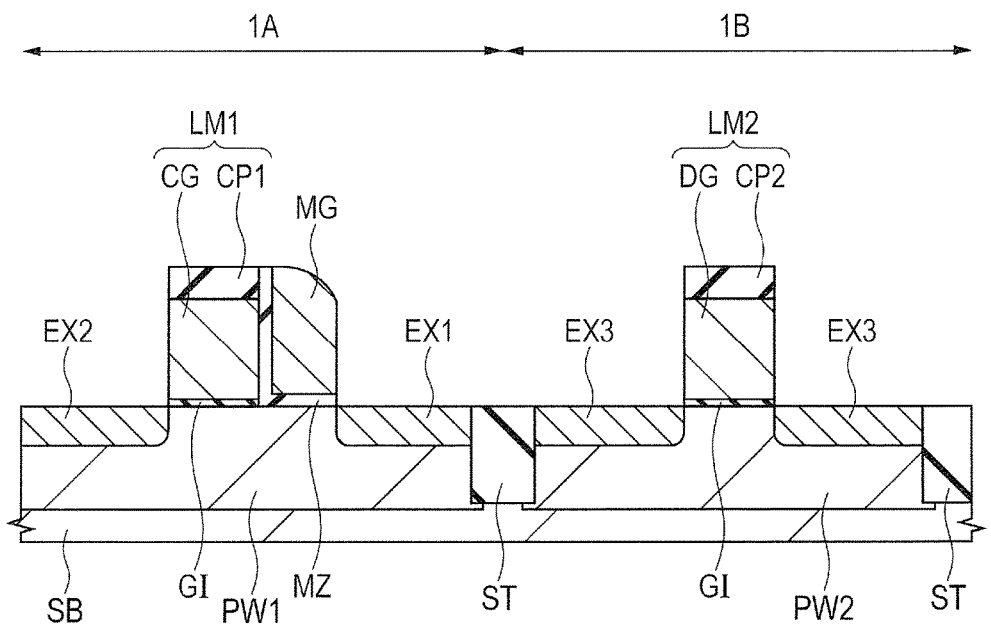

METHOD OF MANUFACTURING SEMICONDUCTOR DEVICE

CROSS-REFERENCE TO RELATED APPLICATIONS

The disclosure of Japanese Patent Application No. 2016-164586 filed on Aug. 25, 2016 including the specification, drawings and abstract is incorporated herein by reference in its entirety.

BACKGROUND

The present invention relates to a method of manufacturing a semiconductor device. For example, the invention can be used for a method of manufacturing a semiconductor device having a nonvolatile memory.

A memory cell, which has a charge trapping insulating film sandwiched by oxide films below a gate electrode of a MISFET, is widely used as a semiconductor device having a memory cell of a nonvolatile memory that is electrically writable and erasable. The memory cell is referred to as metal oxide nitride oxide semiconductor (MONOS) type cell including a single-gate type cell and a split-gate type cell, and is used as a nonvolatile memory of a microcomputer.

A transistor including a metal gate electrode and a high dielectric constant film (high-k film) is increasingly used in a logic circuit portion along with a reduction in power consumption and/or speedup of the microcomputer. A so-called gate last process is known as a method of forming such a transistor, in which a source region and a drain region are formed using a dummy gate electrode including a polycrystalline silicon film formed on a substrate, and then the dummy gate electrode is replaced with a metal gate electrode.

Specifically, the transistor having the dummy gate electrode is covered by an interlayer insulating film, and then a top of the interlayer insulating film is polished to expose a top of the dummy gate electrode. Subsequently, the dummy gate electrode is removed, and a resultant space is filled with a metal gate electrode, resulting in formation of a MISFET having the metal gate electrode. At this time, an $O_3$-TEOS film having a good gap filling characteristic is used as an interlayer insulating film filling between the adjacent dummy gate electrodes.

Japanese Unexamined Patent Application Publication No. 2001-244264 discloses a TEOS film having an improved gap filling characteristic between interconnection patterns.

SUMMARY

A semiconductor device having a nonvolatile memory, which is under consideration by the inventors of this application, includes a memory cell region including a plurality of memory cells and a peripheral circuit region (logic circuit unit, logic circuit region) including a plurality of MISFETs.

In the memory cell region, a plurality of memory cells are arranged in a matrix along a first direction and a second direction orthogonal to each other. Each memory cell includes a control gate electrode formed on a semiconductor substrate with a first gate insulating film in between and extending in the first direction, a memory gate electrode that is formed on the semiconductor substrate with a second gate insulating film including a charge accumulating region and extends in the first direction, and a pair of semiconductor regions (a source region and a drain region) formed on a surface of the semiconductor substrate so as to sandwich the control gate electrode and the memory gate electrode. A space between adjacent control gate electrodes of adjacent memory cells and a space between adjacent memory gate electrodes are filled with an interlayer insulating film including an $O_3$-TEOS film.

However, for example, when an interval between the adjacent control gate electrodes becomes narrower with a reduction in size and/or higher degree of integration of a semiconductor device having a nonvolatile memory, an aspect ratio of the space between the adjacent control gate electrodes becomes higher. The inventors of this application have found that a gap (space) called "seam" is thus formed along the first direction in the interlayer insulating film between the adjacent control gate electrodes, leading to short circuit of the plug electrode described later.

Hence, it is desired that a gap filling characteristic of the interlayer insulating film including the $O_3$-TEOS film is further improved to reduce or prevent formation of the above-described "seam" and thus improve reliability of the semiconductor device having the nonvolatile memory.

Other objects and novel features will be clarified from the description of this specification and the accompanying drawings.

According to one embodiment, there is provided a method of manufacturing a semiconductor device, in which an insulating film (interlayer insulating film) is formed such that a control gate electrode, a memory gate electrode, and a gate electrode are embedded, and then the insulating film is polished by first polishing to expose tops of the control gate electrode, the memory gate electrode, and the gate electrode. Subsequently, a trench is formed by removing the gate electrode and is then filled with a metal film, and a gate electrode including the metal film is selectively formed in the trench by second polishing. The insulating film is an $O_3$-TEOS film having a high gap filling characteristic and thus reduces formation of the seam in the insulating film.

According to the one embodiment, reliability of the semiconductor device can be improved.

BRIEF DESCRIPTION OF THE DRAWINGS

FIG. 11 is a major-part sectional view of the semiconductor device during the manufacturing process following FIG. 10.

FIG. 12 is a major-part sectional view of the semiconductor device during the manufacturing process following FIG. 11.

DETAILED DESCRIPTION

Although each of the following embodiments may be dividedly described in a plurality of sections or embodiments for convenience as necessary, they are not unrelated to one another except for the particularly defined case, and are in a relationship where one is a modification, detailed explanation, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the mentioned number. Furthermore, it will be appreciated that in each of the following embodiments, a constitutional element (including an element step etc.) of the embodiment is not necessarily indispensable except for the particularly defined case and for the case where the constitutional element is considered to be indispensable in principle. Similarly, in each of the following embodiments, when a shape of a constitutional element, a positional relationship, and the like are described, any configuration substantially closely related to or similar to such a shape or the like should be included except for the particularly defined case and for the case where such a configuration is considered to be not included in principle. The same holds true in each of the numerical value and the range.

Hereinafter, some embodiments will be described in detail with reference to the accompanying drawings. In all drawings for explaining the embodiments, components having the same function are designated by the same numeral, and duplicated description is omitted. In the following embodiments, the same or similar portion is not repeatedly described in principle except for a particularly required case.

Furthermore, a sectional view for explaining each embodiment may not be hatched for better viewability. A plan view may be hatched for better viewability.

First Embodiment

Manufacturing Process of Semiconductor Device

The semiconductor devices of a first embodiment and a second embodiment are each a semiconductor device including a nonvolatile memory (a nonvolatile memory element, a flash memory, a nonvolatile semiconductor memory device). In the first embodiment and the second embodiment, the nonvolatile memory is described on the basis of a memory cell based on an n-channel metal insulator semiconductor field effect transistor (MISFET).

A method of manufacturing the semiconductor device of the first embodiment is now described with reference to the drawings.

Figure 1:
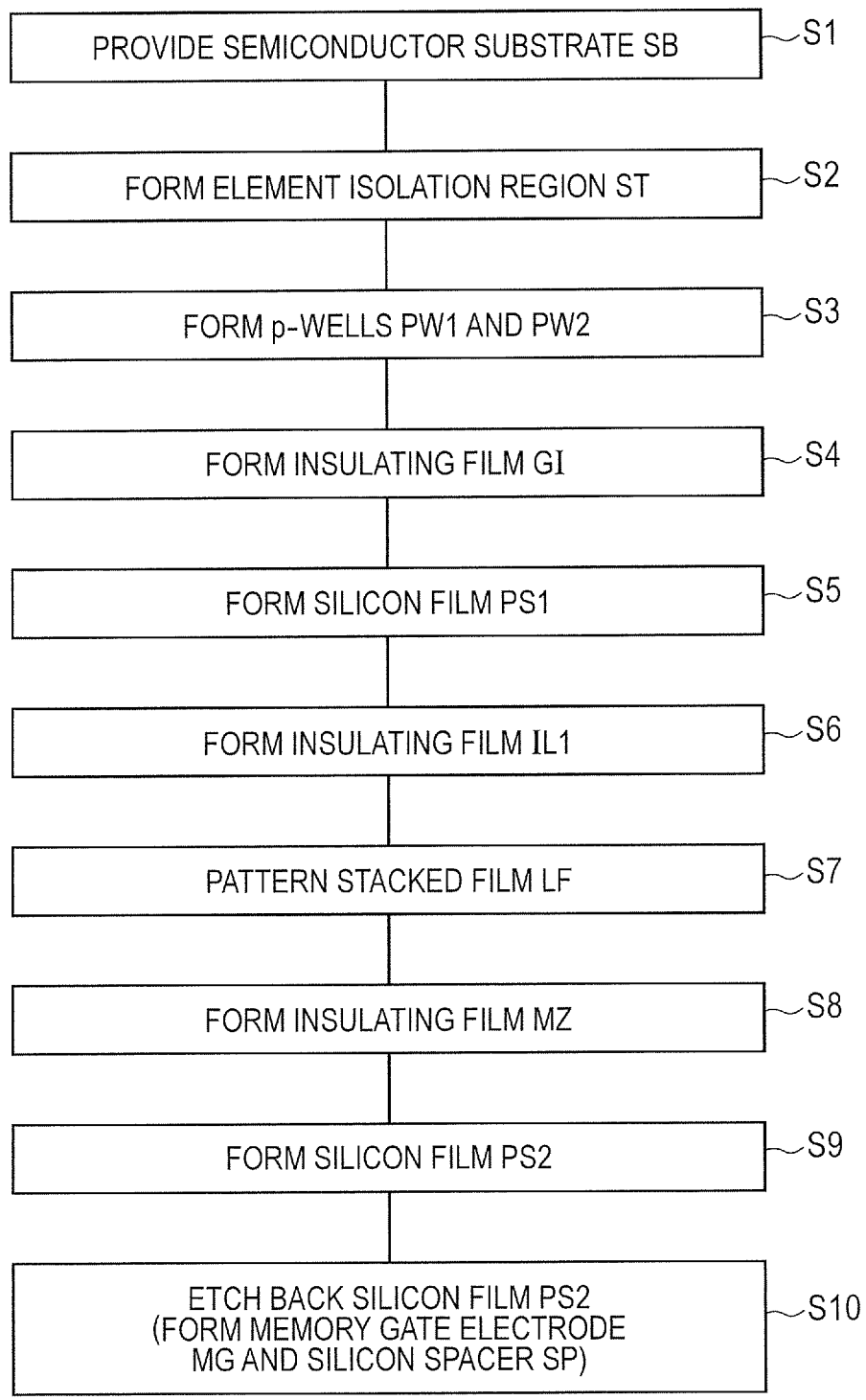
FIG. 1 is a process flow diagram illustrating a manufacturing process of a semiconductor device of a first embodiment.
Figure 2:
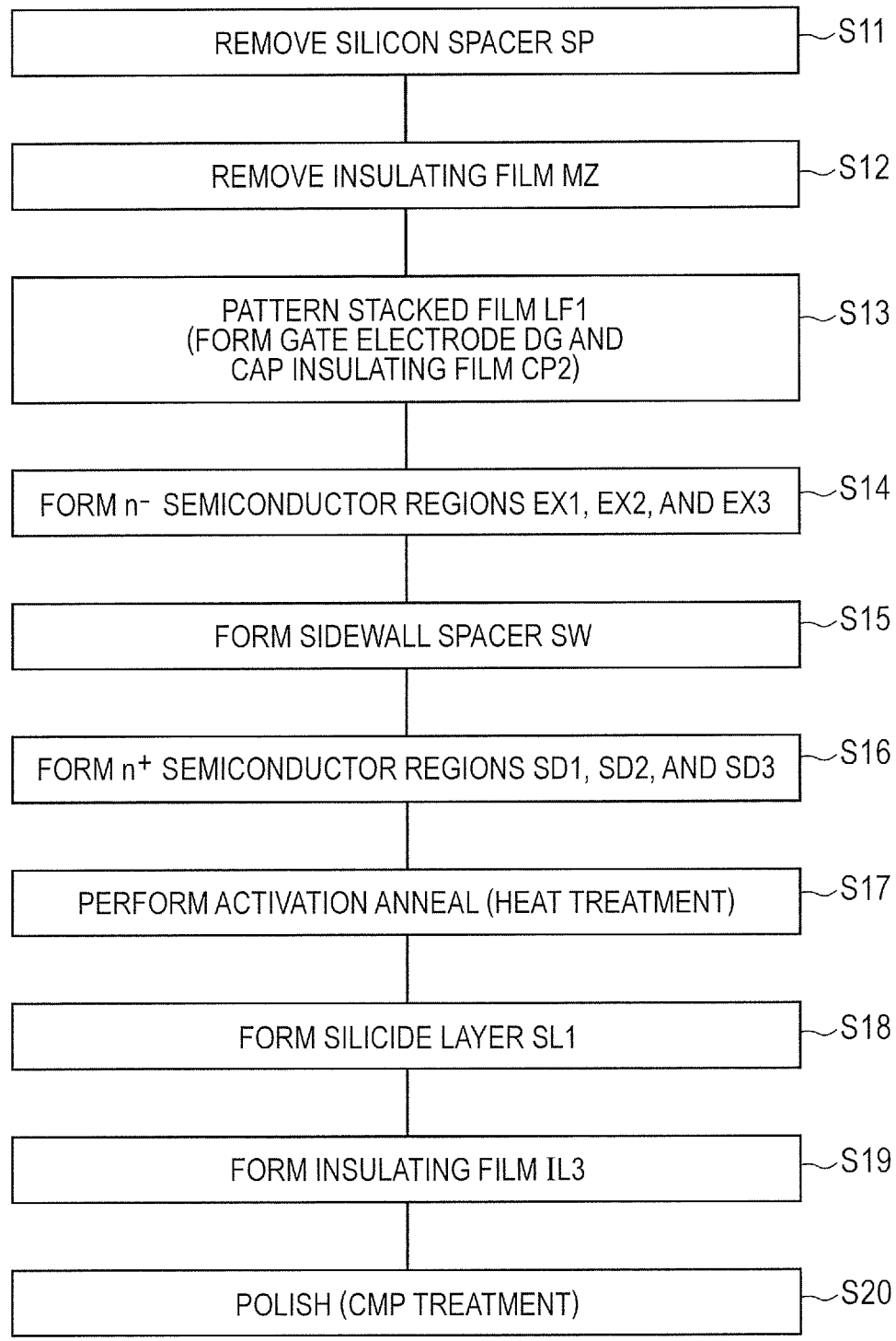
FIG. 2 is a process flow diagram illustrating the manufacturing process of the semiconductor device of the first embodiment.
Figure 3:
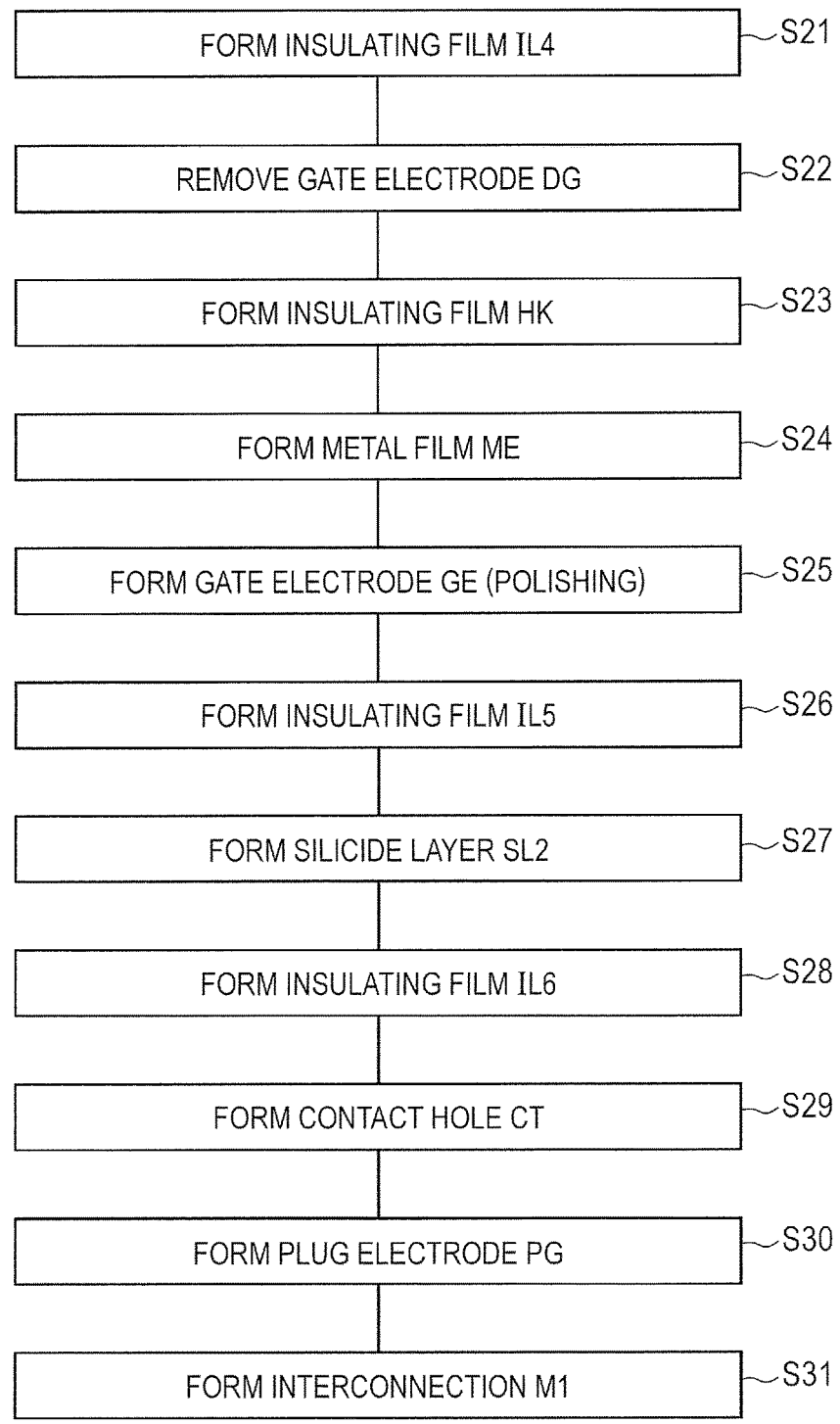
FIG. 3 is a process flow diagram illustrating the manufacturing process of the semiconductor device of the first embodiment.

FIGS. 1 to 3 are each a process flow diagram showing a manufacturing process of the semiconductor device of the first embodiment. FIGS. 4 to 21 are each a major-part sectional view of the semiconductor device of the first embodiment during a manufacturing process of the semiconductor device. FIGS. 4 to 21 each include major-part sectional views of a memory cell region 1A and a peripheral circuit region 1B, showing that a memory cell of a nonvolatile memory is formed in the memory cell region 1A while a MISFET is formed in the peripheral circuit region 1B. FIG. 22 is a major-part plan view of the memory cell region of the semiconductor device of the first embodiment.

In the memory cell region 1A, a plurality of split gate memory cells are arranged in a matrix, and each memory cell is configured of an n-channel MISFET (a control transistor and a memory transistor). A memory cell includes a control gate electrode formed on a semiconductor substrate with a gate insulating film in between, a memory gate electrode formed on a semiconductor substrate with a gate insulating film including a charge accumulating region in between, and a pair of semiconductor regions (a source region and a drain region) formed on a surface of the semiconductor substrate so as to sandwich the control gate electrode and the memory gate electrode.

Although the first embodiment is described with a case where an n-channel MISFET (a control transistor and a memory transistor) is formed in the memory cell region 1A, a p-channel MISFET (a control transistor and a memory transistor) may be formed in the memory cell region 1A with a conductivity type being reversed. As will be described later, the control transistor includes, for example, a control gate electrode including a silicon film (polycrystalline silicon film), and the memory transistor includes a memory gate electrode including, for example, a silicon film (polycrystalline silicon film).

The peripheral circuit region 1B is a region for forming a logic circuit and the like other than the nonvolatile memory, and includes, for example, a processor such as a CPU, a control circuit, a sense amplifier, a column decoder, and a row decoder. The MISFET formed in the peripheral circuit region 1B is a MISFET for a peripheral circuit. Although the first embodiment is described with a case where an n-channel MISFET is formed in the peripheral circuit region 1B, a p-channel MISFET may be formed in the peripheral circuit region 1B with a conductivity type being reversed. Alternatively, a complementary MISFET (CMISFET) or the like may be formed in the peripheral circuit region 1B.

Figure 4:
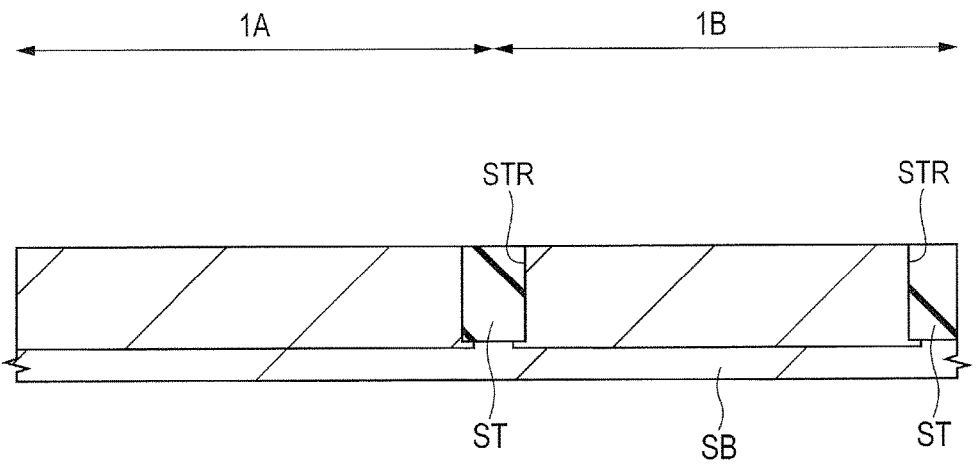
FIG. 4 is a major-part sectional view of the semiconductor device of the first embodiment during the manufacturing process.

As shown in FIG. 4, first, there is provided a semiconductor substrate (semiconductor wafer) SB made of p type single crystal silicon having a specific resistance of about 1 to 10 Ωcm, for example (Step S1 of FIG. 1). Subsequently, an element isolation film (element isolation region) ST defining an active region is formed in a main surface of the semiconductor substrate SB (Step S2 of FIG. 1).

The element isolation film ST is made of an insulator such as silicon oxide and can be formed by, for example, a shallow trench isolation (STI) process or a local oxidization of silicon (LOCOS) process. For example, a trench STR for element isolation is formed in the main surface of the semiconductor substrate SB, and then the element isolation trench STR is filled with an insulating film made of, for example, silicon oxide, and thereby the element isolation film ST can be formed. More specifically, the element isolation trench STR is formed in the main surface of the semiconductor substrate SB, and then an insulating film (for example, a silicon oxide film) to form an element isolation region is formed over the semiconductor substrate SB so as to fill the element isolation trench STR. Subsequently, the insulating film (the insulating film to form the element isolation region) outside the element isolation trench STR is removed, making it possible to form the element isolation film ST including the insulating film embedded in the element isolation trench STR. The element isolation film ST is disposed in the main surface of the semiconductor substrate SB so as to surround the active region in which an element is formed. That is, elements are isolated from each other by the element isolation film ST. The element isolation film ST electrically isolates between the memory cell region 1A and the peripheral circuit region 1B, electrically isolates between memory cells in the memory cell region 1A, and electrically isolates between a plurality of MISFETs in the peripheral circuit region 1B.

Figure 5:
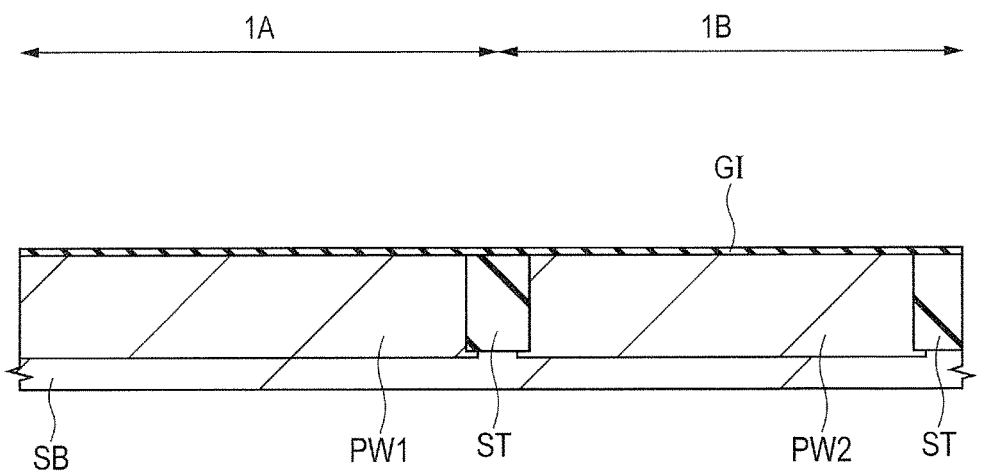
FIG. 5 is a major-part sectional view of the semiconductor device during the manufacturing process following FIG. 4.

Subsequently, as shown in FIG. 5, a p-well PW1 is formed in the memory cell region 1A of the semiconductor substrate SB, and a p-well PW2 is formed in the peripheral circuit region 1B (Step S3 of FIG. 1). The p-wells PW1 and PW2 can be formed by ion-implanting a p type impurity such as boron (B), for example, into the semiconductor substrate SB. The p-wells PW1 and PW2 are each formed with a predetermined depth from the main surface of the semiconductor substrate SB. Since the p-well PW1 and the p-well PW2 have the same conductivity type, the p-wells may be formed by the same ion implantation step or different ion implantation steps. While not shown, the p-well PW1 in the memory cell region 1A is covered with an n-well both in planar view and in sectional view, and is electrically isolated from the p-well PW2 in the peripheral circuit region 1B.

Subsequently, the surface of the semiconductor substrate SB (p-well PW1, PW2) is cleaned by diluted hydrofluoric acid cleaning or the like, and then an insulating film GI form a gate insulating film is formed over the surface of the semiconductor substrate SB (surfaces of the p-wells PW1 and PW2) (Step S4 of FIG. 1).

The insulating film GI is formed of, for example, a thin silicon oxide film or a silicon oxynitride film, and can be formed with a thickness of, for example, about 2 to 3 nm. The insulating film GI can be formed by a thermal oxidation process, a chemical vapor deposition (CVD) process, or a plasma nitriding process. When the insulating film GI is formed by the thermal oxidation process, the insulating film GI is not formed on the element isolation film ST.

In another embodiment, Step S4 can be performed in such a manner that the insulating film GI in the peripheral circuit region 1B is formed in a step and with a thickness different from those of the insulating film GI in the memory cell region 1A.

Figure 6:
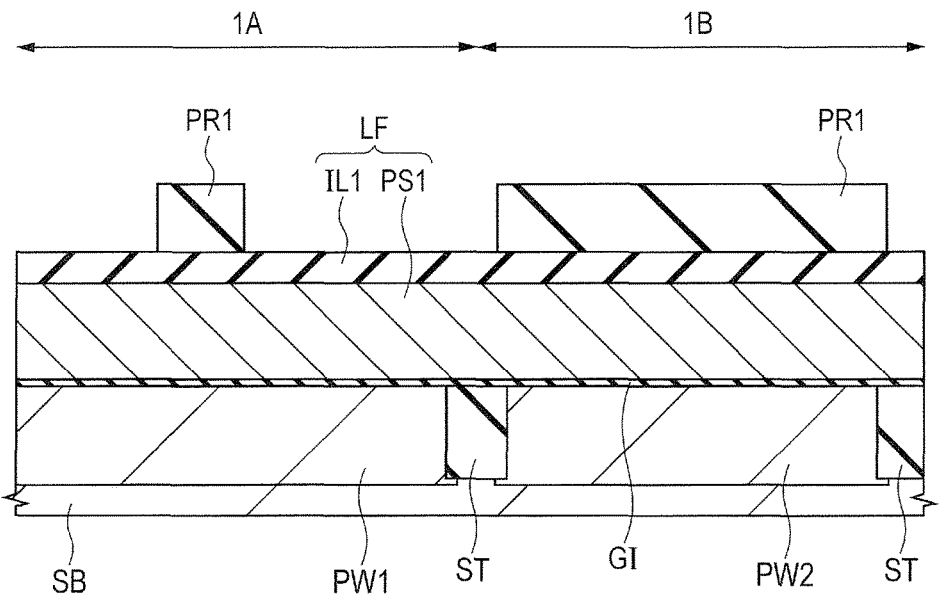
FIG. 6 is a major-part sectional view of the semiconductor device during the manufacturing process following FIG. 5.

Subsequently, as shown in FIG. 6, a silicon film PS1 is formed (deposited) over the main surface (entire main surface) of the semiconductor substrate SB, i.e., over the insulating film GI in the memory cell region 1A and in the peripheral circuit region 1B (Step S5 of FIG. 1).

The silicon film PS1 is a conductive film for forming a control gate electrode CG described later. The silicon film PS1 also serves as a conductive film for forming a gate electrode DG described later. That is, the silicon film PS1 is used to form the control gate electrode CG and the gate electrode DG as described later.

The silicon film PS1 includes a polycrystalline silicon film (polysilicon film), and can be formed by a CVD process or the like. The silicon film PS1 can be deposited at a thickness of, for example, about 50 to 100 nm. The silicon film PS1 can be formed as a low-resistance semiconductor film (doped polysilicon film) by introducing an impurity during film formation or ion-implanting an impurity after film formation. The silicon film PS1 in the memory cell region 1A and in a shunt region SH is preferably an n-silicon film containing an n type impurity such as phosphorus (P) or arsenic (As) introduced therein.

Subsequently, an insulating film IL1 is formed (deposited) over the main surface (the entire main surface) of the semiconductor substrate SB, i.e., on the silicon film PS1 (Step S6 of FIG. 1).

The insulating film IL1 is an insulating film to form cap insulating films CP1 and CP2 described later. The insulating film IL1 includes, for example, a silicon nitride film, and can be formed by a CVD process or the like. The insulating film IL1 can be deposited at a thickness of, for example, about 20 to 50 nm. A stacked film LF of the silicon film PS1 and the insulating film IL1 on the silicon film PS1 is formed by performing Step S5 and Step S6. The stacked film LF thus includes the silicon film PS1 and the insulating film IL1 thereon.

Subsequently, the stacked film LF, i.e., the insulating film IL1 and the silicon film PS1 are patterned by a photolithography technique and an etching technique, thereby a stacked body (stacked structure) LM1 including the control gate electrode CG and the cap insulating film CP1 on the control gate electrode CG is formed in the memory cell region 1A (Step S7 of FIG. 1).

Figure 7:
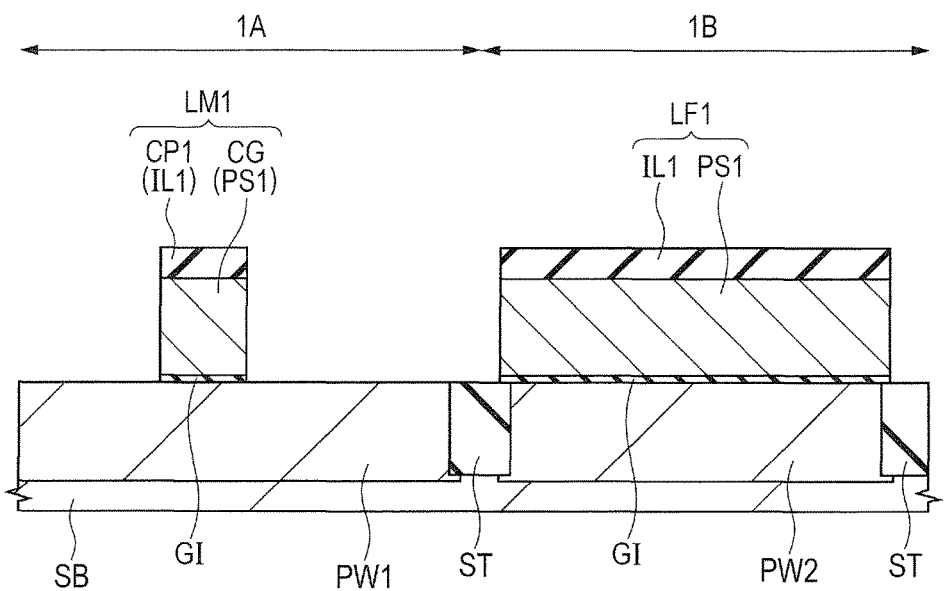
FIG. 7 is a major-part sectional view of the semiconductor device during the manufacturing process following FIG. 6.

Step S7 can be performed as follows. Specifically, first, as shown in FIG. 6, a photoresist pattern PR1 is formed as a resist pattern on the insulating film IL1 by a photolithography process. The photoresist pattern PR1 is formed in a certain region, over which the control gate electrode CG is to be formed, of the memory cell region 1A and in the entire peripheral circuit region 1B. Subsequently, the stacked film LF of the silicon film PS1 and the insulating film IL1 in the memory cell region 1A is etched and patterned (preferably dry-etched) using the photoresist pattern PR1 as an etching mask, and then the photoresist pattern PR1 is removed. Consequently, as shown in FIG. 7, a stacked body LM1 of the control gate electrode CG including the patterned silicon film PS1 and the cap insulating film CP1 including the patterned insulating film IL1 is formed in the memory cell region 1A.

The stacked body LM1 includes the control gate electrode CG and the cap insulating film CP1 on the control gate electrode CG, and is formed on the semiconductor substrate SB (p-well PW1) in the memory cell region 1A with the insulating film GI in between. The control gate electrode CG and the cap insulating film CP1 have substantially the same planar shape and overlap with each other in planar view.

By performing Step S7, the silicon film PS1 and the insulating film IL1 are removed except for a portion to be formed into the stacked body LM1 in the memory cell region 1A. On the other hand, the photoresist pattern PR1 is formed over the entire peripheral circuit region 1B. Hence, even if Step S7 is performed, the stacked film LF1 of the silicon film PS1 and the insulating film IL1 on the silicon film PS1 remains in the peripheral circuit region 1B while being not removed and thus not patterned. The stacked film LF remaining in the peripheral circuit region 1B is referred to as stacked film LF1 with a reference symbol LF1.

The control gate electrode CG including the patterned silicon film PS1 is formed in the memory cell region 1A, and serves as a gate electrode for the control transistor. The insulating film GI remaining under the control gate electrode CG serves as a gate insulating film of the control transistor. In the memory cell region 1A, therefore, the control gate electrode CG including the silicon film PS1 is provided on the semiconductor substrate SB (p-well PW1) with the insulating film GI as the gate insulating film in between.

In the memory cell region 1A, the insulating film GI other than its portion covered with the stacked body LM1, i.e., the insulating film GI other than its portion to be the gate insulating film can be removed by dry etching in the patterning step of Step S7, or by wet etching performed after the dry etching.

Figure 8:
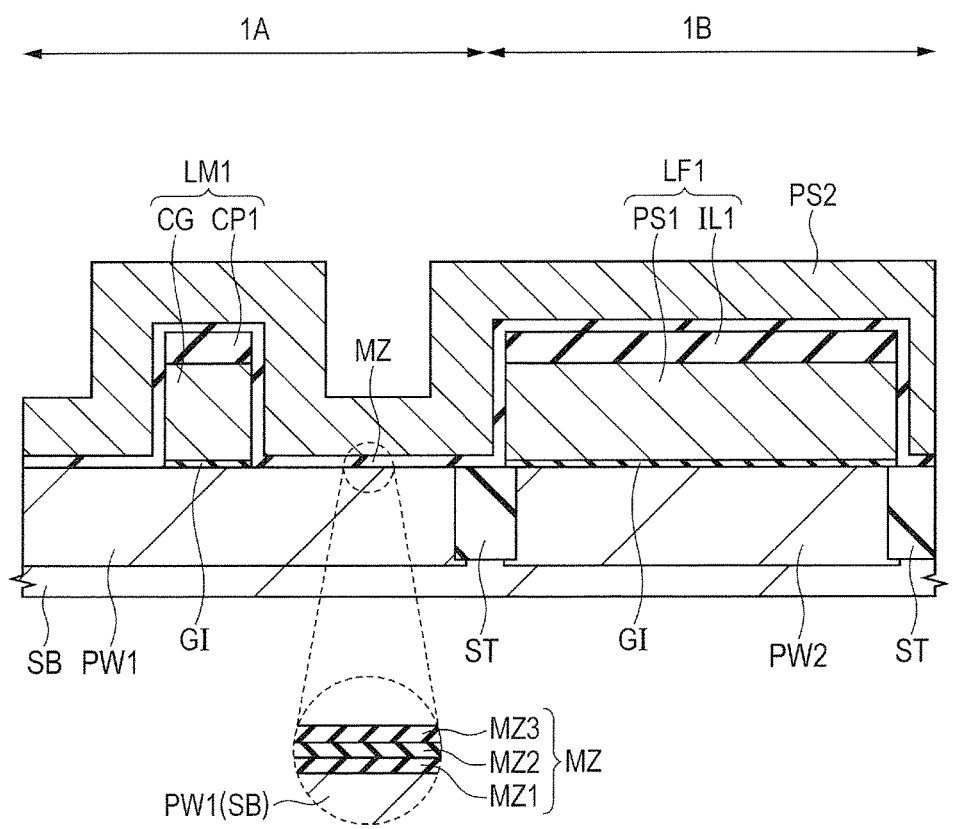
FIG. 8 is a major-part sectional view of the semiconductor device during the manufacturing process following FIG. 7.

Subsequently, as shown in FIG. 8, an insulating film MZ for the gate insulating film of the memory transistor is formed over the entire main surface of the semiconductor substrate SB, i.e., over the main surface (surface) of the semiconductor substrate SB and on surfaces (a top and side faces) of the stacked body LM1 (Step S8 of FIG. 1).

Since the stacked film LF1 remains in the peripheral circuit region 1B, the insulating film MZ may also be formed on surfaces (a top and side faced) of the stacked film LF1. Hence, in Step S8, the insulating film MZ is formed over the semiconductor substrate SB so as to cover the stacked body LM1 in the memory cell region 1A and the stacked film LF1 in the peripheral circuit region 1B.

The insulating film MZ is an insulating film to form the gate insulating film of the memory transistor, and internally has a charge accumulating part. The insulating film MZ includes a silicon oxide film (oxide film) MZ1, a silicon nitride film (nitride film) MZ2 formed on the silicon oxide film MZ1, and a silicon oxide film (oxide film) MZ3 formed on the silicon nitride film MZ2. The stacked film of the silicon oxide film MZ1, the silicon nitride film MZ2, and the silicon oxide film MZ3 may be regarded as an oxide-nitride-oxide (ONO) film.

In FIG. 8, the insulating film MZ including the silicon oxide film MZ1, the silicon nitride film MZ2, and the silicon oxide film MZ3 is shown as the single insulating film MZ for better viewability. Although the silicon nitride film MZ2 is exemplified as the insulating film (charge accumulating layer) having a trap level in the first embodiment, the insulating film is not limited to the silicon nitride film. For example, a high-dielectric-constant film having a dielectric constant higher than a silicon nitride film, such as an aluminum oxide (alumina) film, a hafnium oxide film, or a tantalum oxide film, can be used as the charge accumulating layer or the charge accumulating part. In addition, the charge accumulating layer or the charge accumulating part can be formed of silicon nanodot.

In order to form the insulating film MZ, for example, the silicon oxide film MZ1 is first formed by a thermal oxidation process (preferably ISSG oxidation), and then the silicon nitride film MZ2 is deposited on the silicon oxide film MZ1 by a CVD process, and then the silicon oxide film MZ3 is formed on the silicon nitride film MZ2 by a CVD process, a thermal oxidation process, or both. It is thus possible to form the insulating film MZ including the stacked film of the silicon oxide film MZ1, the silicon nitride film MZ2, and the silicon oxide film MZ3.

It is possible to adjust thicknesses of the silicon oxide films MZ1, MZ2, and MZ3 to, for example, about 2 to 10 nm, about 5 to 15 nm, and about 2 to 10 nm, respectively. The last oxide film, i.e., the uppermost silicon oxide film MZ3 of the insulating film MZ can be formed by, for example, oxidizing an upper portion of the nitride film (the silicon nitride film MZ2 as an intermediate layer of the insulating film MZ) so as to be formed as a high-withstand-voltage film. The insulating film MZ serves as a gate insulating film of the memory gate electrode MG formed later.

Subsequently, the silicon film PS2 is formed (deposited) as a conductive film to form the memory gate electrode MG over the main surface (entire main surface) of the semiconductor substrate SB, i.e., on the insulating film MZ so as to cover the stacked body LM1 in the memory cell region 1A and cover the stacked film LF1 in the peripheral circuit region 1B (Step S9 of FIG. 1).

The silicon film PS2 is a conductive film to form the gate electrode of the memory transistor. The silicon film PS2 includes a polycrystalline silicon film and can be formed by a CVD process or the like. The silicon film PS2 can be deposited at a thickness of about 30 to 150 nm, for example.

The silicon film PS2 is a low-resistance semiconductor film (doped polysilicon film) containing an impurity through introduction of the impurity during film formation or through ion implantation of the impurity after film formation. The silicon film PS2 is preferably an n-silicon film containing an n type impurity such as phosphorus (P) or arsenic (As) introduced therein.

Subsequently, the silicon film PS2 is etched back (through etching, anisotropic dry etching, or anisotropic etching) by an anisotropic etching technique (Step S10 of FIG. 1).

Figure 9:
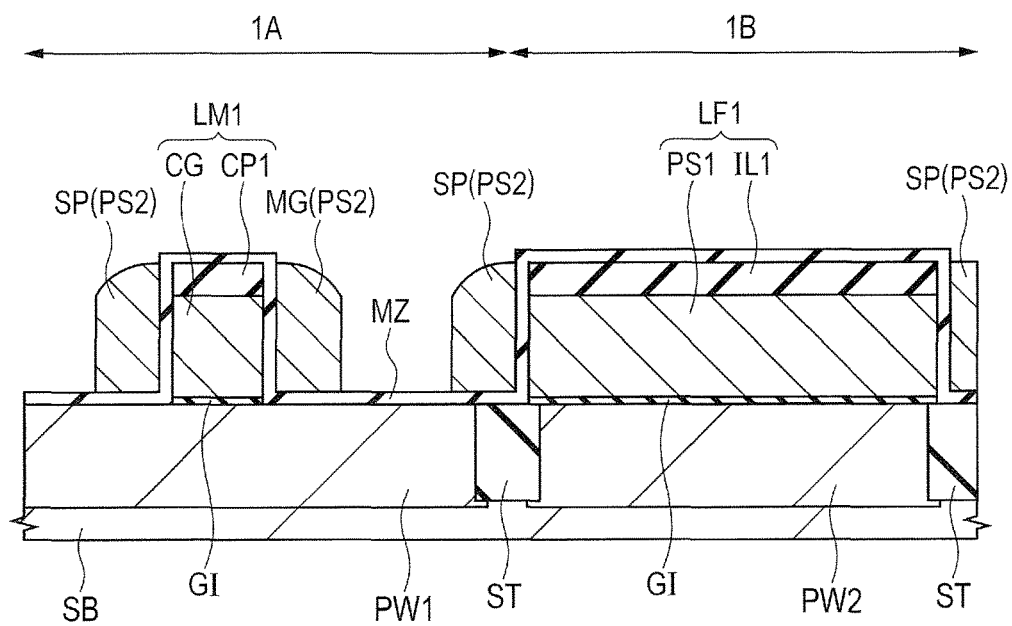
FIG. 9 is a major-part sectional view of the semiconductor device during the manufacturing process following FIG. 8.

The silicon film PS2 is etched back by the etch back step of Step S10, thereby the silicon film PS2 is left in a form of a sidewall spacer on both sidewalls of the stacked body LM1 with the insulating film MZ in between, and the silicon film PS2 in a region other than the memory cell region 1A is removed. Consequently, as shown in FIG. 9, in the memory cell region 1A, the memory gate electrode MG is formed by the silicon film PS2 remaining in the form of the sidewall spacer on one of the two sidewalls of the stacked body LM1 with the insulating film MZ in between, and a silicon spacer SP is formed by the silicon film PS2 remaining in the form of the sidewall spacer on the other sidewall with the insulating film MZ in between. The memory gate electrode MG is formed on the insulating film MZ so as to be adjacent to the stacked body LM1 with the insulating film MZ in between. Since the stacked body LM1 includes the control gate electrode CG and the cap insulating film CP1 on the control gate electrode CG, the memory gate electrode MG is formed so as to be adjacent to the control gate electrode CG and the cap insulating film CP1 with the insulating film MZ in between.

The silicon spacer SP is also formed on sidewalls of the stacked film LF1, which remains in the peripheral circuit region 1B, with the insulating film MZ in between.

The silicon spacer SP can be regarded as a sidewall spacer made of a conductor, i.e., a conductor spacer. In the memory cell region 1A, the memory gate electrode MG and the silicon spacer SP are formed on the opposite sidewalls of the stacked body LM1 while having a substantially symmetrical structure with respect to the stacked body LM1.

The heights of the memory gate electrode MG and the silicon spacer SP are each preferably higher than height of the control gate electrode CG at a stage where the etch back step of Step S10 is finished. The height of the memory gate electrode MG is made higher than the height of the control gate electrode CG, thereby an upper portion of the memory gate electrode MG can be securely exposed in a polishing step of Step S20 as described later, and thus exposure failure of the memory gate electrode MG can be prevented.

Figure 10:
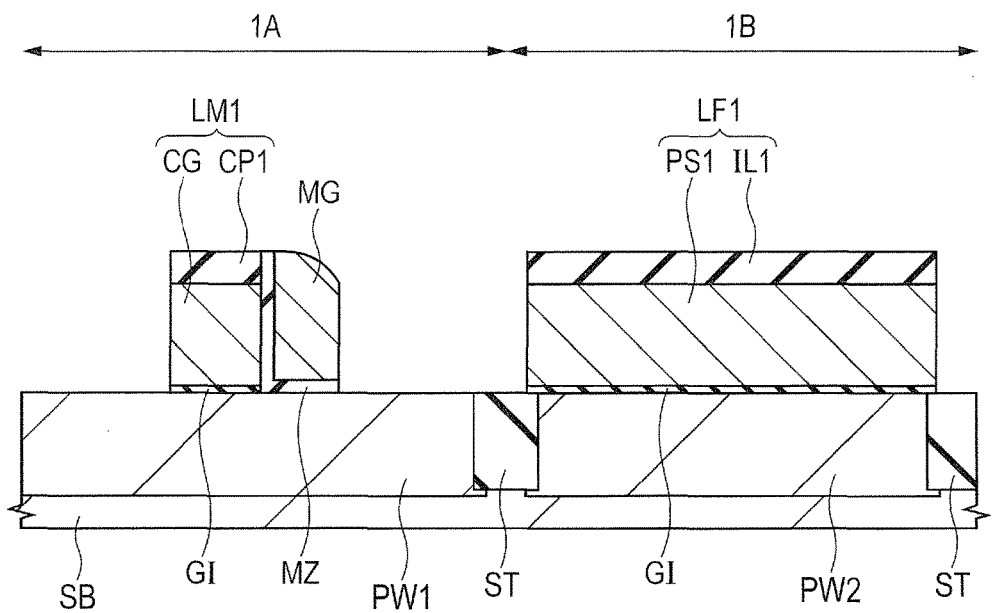
FIG. 10 is a major-part sectional view of the semiconductor device during the manufacturing process following FIG. 9.

Subsequently, an undepicted photoresist pattern is formed over the semiconductor substrate SB by a photolithography technique so as to cover the memory gate electrode MG and expose the silicon spacer SP, and then the silicon spacer SP is removed by dry etching using the photoresist pattern as an etching mask (Step S11 of FIG. 2). Subsequently, the photoresist pattern is removed. As shown in FIG. 10, the silicon spacer SP is removed by an etching step of Step S11, but the memory gate electrode MG, which has been covered with the photoresist pattern, remains without being etched. The silicon spacer SP on the side walls of the stacked body LF1 is removed.

Subsequently, as shown in FIG. 10, a certain portion, which is exposed while being not covered with the memory gate electrode MG, of the insulating film MZ is removed by etching (for example, wet etching) (Step S12 of FIG. 2). At this time, the insulating film MZ, which is located under the memory gate electrode MG and between the memory gate electrode MG and the stacked body LM1, remains without being removed in the memory cell region 1A, while the insulating film MZ in any other region is removed. As seen from FIG. 10, in the memory cell region 1A, the insulating film MZ continuously extends over both regions, i.e., a region between the memory gate electrode MG and the semiconductor substrate SB (p-well PW1) and a region between the memory gate electrode MG and the stacked body LM1.

The insulating film MZ in the region between the memory gate electrode MG and the semiconductor substrate SB (p-well PW1) serves as the gate insulating film of the memory transistor.

Subsequently, the stacked film LF1 in the peripheral circuit region 1B is patterned using a photolithography technique and an etching technique, thereby, as shown in FIG. 11, a stacked body (stacked structure) LM2 having a gate electrode DG and a cap insulating film CP2 on the gate electrode DG is formed in the peripheral circuit region 1B (Step S13 of FIG. 2).

The patterning step of Step S13 can be performed, for example, as follows. Specifically, first, an undepicted photoresist pattern is formed over the main surface of the semiconductor substrate SB by a photolithography process. The photoresist pattern is formed in the entire memory cell region 1A and in a region, over which the gate electrode DG is to be formed, of the peripheral circuit region 1B. Hence, the memory gate electrode MG and the stacked body LM1 are covered with the photoresist pattern. Subsequently, the stacked film LF1 of the silicon film PS1 and the insulating film IL1 in the peripheral circuit region 1B is etched (preferably dry-etched) and patterned using the photoresist pattern as an etching mask, and then the photoresist pattern is removed. Consequently, as shown in FIG. 11, a stacked body LM2, which includes the gate electrode DG including the patterned silicon film PS1 and the cap insulating film CP2 including the patterned insulating film IL1, is formed in the peripheral circuit region 1B.

The stacked body LM2, which includes the gate electrode DG and the cap insulating film CP2 on the gate electrode DG, is formed on the semiconductor substrate SB (p-well PW2) in the peripheral circuit region 1B with the insulating film GI in between. The gate electrode DG and the cap insulating film CP2 have substantially the same planar shape and are overlap with each other in planar view. The gate electrode DG is a dummy gate electrode (pseudo gate electrode), and is thus removed later. The gate electrode DG therefore can be referred to as dummy gate electrode. Since the gate electrode DG is removed later and replaced with a gate electrode GE as described later, the gate electrode DG may be regarded as a replacement gate electrode.

In the peripheral circuit region 1B, the insulating film GI other than the portion covered with the stacked body LM2 can be removed by dry etching performed in the patterning step of Step S13 or wet etching after the dry etching.

In this way, in the peripheral circuit region 1B, the stacked body LM2 including the gate electrode DG and the cap insulating film CP2 on the gate electrode DG is formed on the semiconductor substrate SB (p-well PW2) with the insulating film GI in between.

In this way, as shown in FIG. 11, in the memory cell region 1A, the control gate electrode CG is formed on the semiconductor substrate SB with the insulating film GI in between, and the memory gate electrode MG is formed on the semiconductor substrate SB with the insulating film MZ in between. Further, in the peripheral circuit region 1B, the gate electrode DG is formed on the semiconductor substrate SB with the insulating film GI in between. In this state, the cap insulating film CP1 is provided on the control gate electrode CG, and the cap insulating film CP2 is provided on the gate electrode DG.

Subsequently, as shown in FIG. 12, n⁻ semiconductor regions (impurity diffusion layers) EX1, EX2, and EX3 are formed by an ion implantation process or the like (Step S14 of FIG. 2).

In Step S14, an n type impurity such as arsenic (As) or phosphorus (P) is introduced into the semiconductor substrate SB (p-well PW1, PW2) by an ion implantation process while the stacked body LM1, the memory gate electrode MG, and the stacked body LM2 are collectively used as a mask (ion implantation blocking mask), thereby n⁻ type semiconductor regions EX1, EX2, and EX3 can be formed. At this time, in the memory cell region 1A, the memory gate electrode MG serves as the mask (ion implantation blocking mask), thereby the n⁻ semiconductor region EX1 is formed in self-alignment with a sidewall (on a side opposite to a side adjacent to the control gate electrode CG with the insulating film MZ in between) of the memory gate electrode MG. In the memory cell region 1A, the stacked body LM1 serves as the mask (ion implantation blocking mask), thereby the n⁻ type semiconductor region EX2 is formed in self-alignment with a sidewall (on a side opposite to a side adjacent to the memory gate electrode MG with the insulating film MZ in between) of the control gate electrode CG. In the peripheral circuit region 1B, the stacked body LM2 serves as the mask (ion implantation blocking mask), thereby the n⁻ type semiconductor region EX3 is formed in self-alignment with both sidewalls of the gate electrode DG. The n⁻ type semiconductor region EX1 and the n⁻ type semiconductor region EX2 can each serve as part of a source/drain region (source or drain region) of the memory cell formed in the memory cell region 1A, and the n⁻ type semiconductor region EX3 can serve as part of a source/drain region (source or drain region) of the MISFET formed in the peripheral circuit region 1B. The n⁻ type semiconductor regions EX1, EX2, and EX3 may be formed by the same ion implantation step or different ion implantation steps.

Subsequently, a sidewall spacer (sidewall, sidewall insulating film) SW including an insulating film is formed as a sidewall insulating film on the sidewall of the stacked body LM1, on the sidewall of the memory gate electrode MG, and on the sidewalls of the stacked body LM2 (Step S15 of FIG. 2). The sidewall spacer SW can be regarded as the sidewall insulating film.

Figure 13:
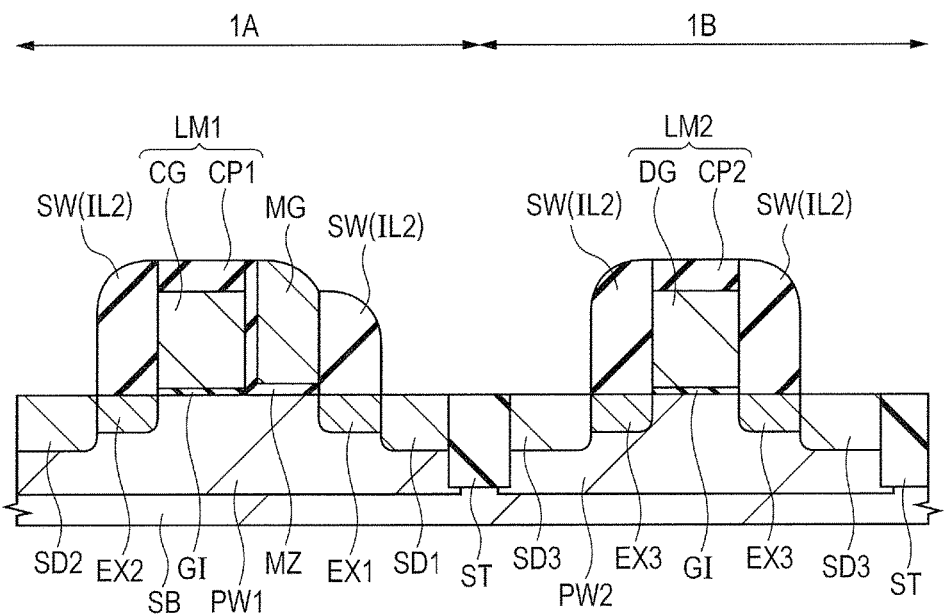
FIG. 13 is a major-part sectional view of the semiconductor device during the manufacturing process following FIG. 12.

Step S15, i.e., a step of forming the sidewall spacer SW can be performed, for example, as follows. Specifically, the insulating film IL2 is formed (deposited) over the entire main surface of the semiconductor substrate SB. The insulating film IL2 includes, for example, a silicon oxide film, a silicon nitride film, or a stacked film thereof, and can be formed by a CVD process or the like. The insulating film IL2 is formed over the semiconductor substrate SB so as to cover the memory gate electrode MG and the stacked bodies LM1 and LM2. Subsequently, as shown in FIG. 13, the insulating film IL2 is etched back (through etching, dry etching, or anisotropic dry etching) by an anisotropic etching technique. Consequently, the insulating film IL2 remains selectively on the sidewall of the stacked body LM1, on the sidewall of the memory gate electrode MG, and on the sidewalls of the stacked body LM2, and thus the sidewall spacers SW are formed. In the memory cell region 1A, the sidewall spacer SW is formed on one sidewall of the stacked body LM1, the one sidewall being on the side opposite to the side adjacent to the memory gate electrode MG with the insulating film MZ in between, and on one sidewall of the memory gate electrode MG, the one sidewall being on the side opposite to the side adjacent to the stacked body LM1 with the insulating film MZ in between. The sidewall spacer SW is formed on both sidewalls of the stacked body LM2 in the peripheral circuit region 1B.

Subsequently, as shown in FIG. 13, n⁺ type semiconductor regions (impurity diffusion layers) SD1, SD2, and SD3 are formed by an ion implantation process or the like (Step S16 of FIG. 2).

In Step S16, for example, an n type impurity such as arsenic (As) or phosphorus (P) is introduced into the semiconductor substrate SB (p-well PW1, PW2) by an ion implantation process while the stacked body LM1, the memory gate electrode MG, the stacked body LM2, and the sidewall spacers SW are collectively used as a mask (ion implantation blocking mask), thereby the n⁺ type semiconductor regions SD1, SD2, and SD3 can be formed. At this time, in the memory cell region 1A, the memory gate electrode MG, the sidewall spacer SW on the memory gate electrode MG, and the sidewall spacer SW on the sidewall of the memory gate electrode MG serve as the mask (ion implantation blocking mask), thereby the n⁺ type semiconductor region SD1 is formed in self-alignment with the sidewall spacer SW on the sidewall of the memory gate electrode MG. In the memory cell region 1A, the stacked body LM1 and the sidewall spacer SW on the sidewall of the stacked body LM1 serve as the mask (ion implantation blocking mask), thereby the n⁺ type semiconductor region SD2 is formed in self-alignment with the sidewall spacer SW on the sidewall of the stacked body LM1. In the peripheral circuit region 1B, the stacked body LM2 and the sidewall spacers SW on the sidewalls of the stacked body LM2 serve as the mask (ion implantation blocking mask), thereby the respective n⁺ type semiconductor regions SD3 are formed in self-alignment with the sidewall spacers SW on both sidewalls of the stacked body LM2. Consequently, a lightly doped drain (LDD) structure is formed. The n⁺ type semiconductor regions SD1, SD2, and SD3 may be formed by the same ion implantation step or different ion implantation steps. It is also possible that the n⁺ type semiconductor region SD1 and the n⁺ type semiconductor region SD2 are formed by the same ion implantation step while the n⁺ type semiconductor regions SD3 are formed by another ion implantation step.

In this way, the n⁻ type semiconductor region EX1 and the n⁺ type semiconductor region SD1 having an impurity concentration higher than the n⁻ type semiconductor region EX1 form an n type semiconductor region serving as the source region of the memory transistor, and the n⁻ type semiconductor region EX2 and the n⁺ type semiconductor region SD2 having an impurity concentration higher than the n⁻ type semiconductor region EX2 form an n type semiconductor region serving as the drain region of the control transistor. The n⁻ type semiconductor region EX3 and the n⁺ type semiconductor region SD3 having an impurity concentration higher than the n⁻ type semiconductor region EX3 form an n type semiconductor region serving as the source/drain region of the MISFET in the peripheral circuit region 1B. The n⁺ type semiconductor region SD1 has a higher impurity concentration and a deeper junction depth than the n⁻ type semiconductor region EX1, the n⁺ type semiconductor region SD2 has a higher impurity concentration and a deeper junction depth than the n⁻ type semiconductor region EX2, and the n⁺ type semiconductor region SD3 has a higher impurity concentration and a deeper junction depth than the n⁻ type semiconductor region EX3.

Subsequently, activation anneal is performed as heat treatment for activating the impurity introduced into each of the semiconductor regions (n⁻ type semiconductor regions EX1, EX2, EX3, and n⁺ type semiconductor regions SD1, SD2, SD3) for the sources and the drains (Step S17 of FIG. 2).

In this way, the memory cell of the nonvolatile memory is formed in the memory cell region 1A. On the other hand, the gate electrode DG is a dummy gate electrode. In the MISFET in the peripheral circuit region 1B, although the source/drain region has been formed, a gate electrode to be finally used (the gate electrode GE described later) is not formed yet.

Subsequently, a silicide layer SL1 is formed (Step S18 of FIG. 2). The silicide layer SL1 can be formed in the following manner.

First, a metal film is formed (deposited) over the entire main surface of the semiconductor substrate SB including the tops (surfaces) of the n⁺ type semiconductor regions SD1, SD2, and SD3 so as to cover the stacked body LM1, the memory gate electrode MG, the stacked body LM2, and the sidewall spacers SW. The metal film can be a simple metal film (pure metal film) or an alloy film, and preferably includes a cobalt (Co) film, a nickel (Ni) film, or a nickel-platinum alloy film. The nickel-platinum alloy film (platinum-added nickel film) is particularly preferred. The metal film can be formed by a sputtering process or the like.

Figure 14:
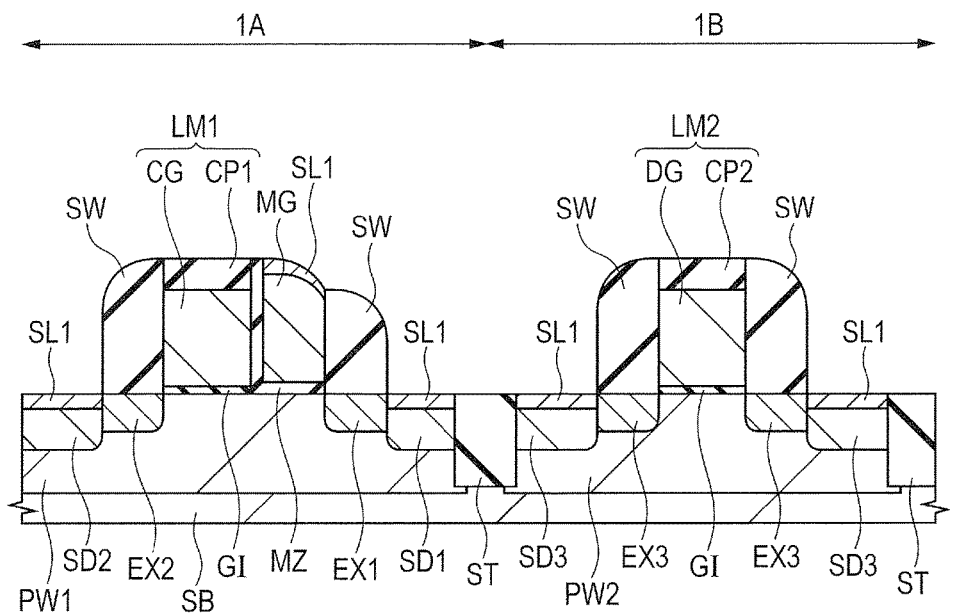
FIG. 14 is a major-part sectional view of the semiconductor device during the manufacturing process following FIG. 13.

Subsequently, heat treatment is performed on the semiconductor substrate SB so that upper layer portions (surface layer portions) of the n⁺ type semiconductor regions SD1, SD2, and SD3 and the memory gate electrode MG are each reacted with the metal film. Consequently, as shown in FIG. 14, a silicide layer SL1 is formed on the upper portions (tops, surfaces, upper layer portions) of the n⁺ type semiconductor regions SD1, SD2, and SD3 and the memory gate electrode MG. The silicide layer SL1 can be, for example, a cobalt silicide layer (for the metal film including cobalt), a nickel silicide layer (for the metal film including nickel), or a platinum-added nickel silicide layer (for the metal film including nickel-platinum alloy). The platinum-added nickel silicide layer is a nickel silicide layer to which platinum has been added, i.e., a nickel silicide layer containing platinum, and thus may be referred to as nickel-platinum silicide layer. Subsequently, the unreacted metal film is removed by wet etching or the like, and then further heat treatment may be performed to reduce a resistance of the silicide layer SL1.

In this way, a so-called salicide (self aligned silicide) process is performed to form the silicide layer SL1 in each of the upper portions of the n⁺ type semiconductor regions SD1, SD2, and SD3 and the memory gate electrode MG, thereby resistance of each of the source and the drain and a resistance of the memory gate electrode MG can be reduced.

Figure 15:
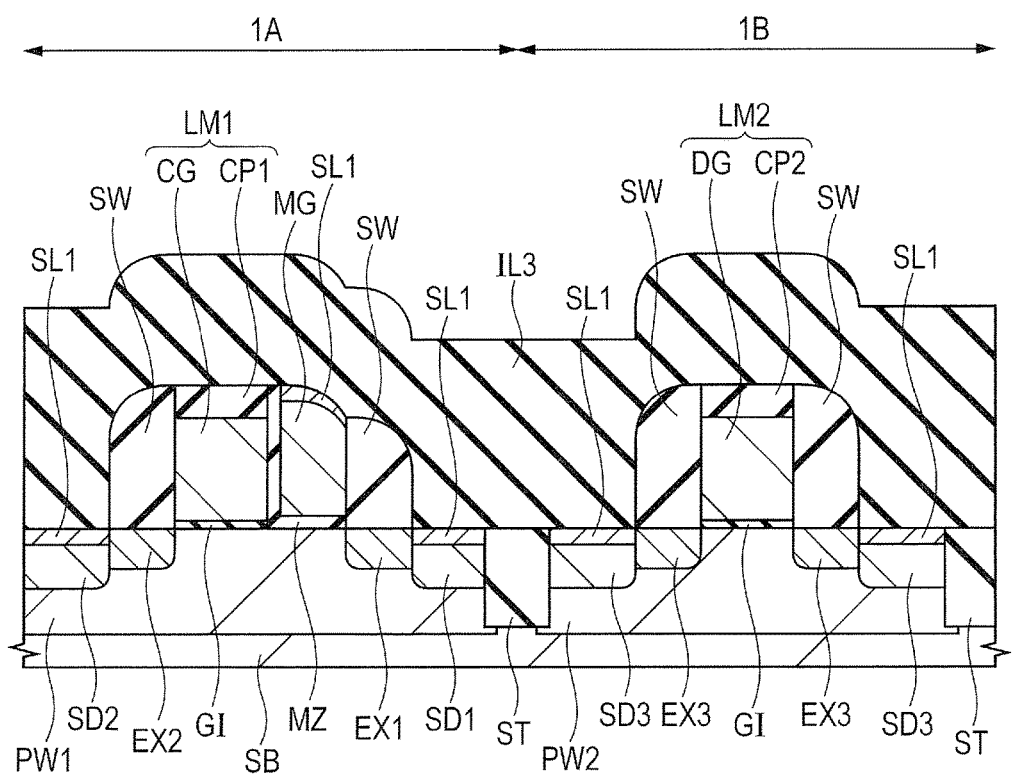
FIG. 15 is a major-part sectional view of the semiconductor device during the manufacturing process following FIG. 14.

Subsequently, as shown in FIG. 15, an insulating film IL3 is formed (deposited) as an interlayer insulating film over the entire main surface of the semiconductor substrate SB so as to cover the stacked body LM1, the memory gate electrode MG, the stacked body LM2, and the sidewall spacer SW (Step S19 of FIG. 2).

The insulating film IL3 includes a silicon oxide film, and can be formed by a CVD process, for example. It is important that the silicon oxide film is an $O_3$-TEOS film to fill between adjacent control gate electrodes, between adjacent memory gate electrodes, or between gate electrodes DG without forming the above-described gap called "seam".

It is important that the $O_3$-TEOS film is deposited sufficiently thick such that a top of the $O_3$-TEOS film is higher than the tops of the respective cap insulating films CP1 and CP2 of the stacked structures LM1 and LM2 over each of the n⁺ type semiconductor regions SD1, SD2, and SD3. It will be appreciated that the top of the $O_3$-TEOS film is higher than the top of the control gate electrode CG of the stacked structure LM1, the top of the memory gate electrode MG, and the top of the gate electrode DG of the stacked structure LM2.

The $O_3$-TEOS film is formed by an atmospheric pressure chemical vapor deposition (APCVD) process or a sub atmospheric chemical vapor deposition (SACVD) process. The process is performed using tetraethyl orthosilicate (TEOS) and ozone ($O_3$) as material gases under a condition of a pressure of 300 to 500 Torr and a temperature of 450 to 550° C. For example, nitrogen ($N_2$) is used as a carrier gas for the TEOS.

The inventors of this application have found that the $O_3$-TEOS film has a better gap filling characteristic with a larger number of O—H groups contained therein. In the first embodiment, therefore, the $O_3$-TEOS film has a silanol ratio, which is a ratio of silanol (Si—O—H) groups to siloxane (Si—O—Si) groups, of 10% or more. An existing $O_3$-TEOS film typically has a silanol group ratio of less than 10%, for example, 5 to 8%. The inventors have found that the $O_3$-TEOS film containing a large number of O—H groups can be formed by controlling time (incubation) from injection of a material gas into a chamber of a film formation apparatus to start of film growth (for example, 5 sec or less).

However, the $O_3$-TEOS film containing a large number of O—H groups has physical properties of a high (fast) wet etching rate and a high relative dielectric constant while having a good gap filling characteristic. Investigations of the inventors of this application have revealed that the $O_3$-TEOS film is subjected to heat treatment at 300 to 400° C. in an oxidizing atmosphere ($O_2$, $H_2O$, $H_2O_2$, or $O_3$), thereby making it possible to reduce (slow) the wet etching rate and reduce the relative dielectric constant.

Figure 23:
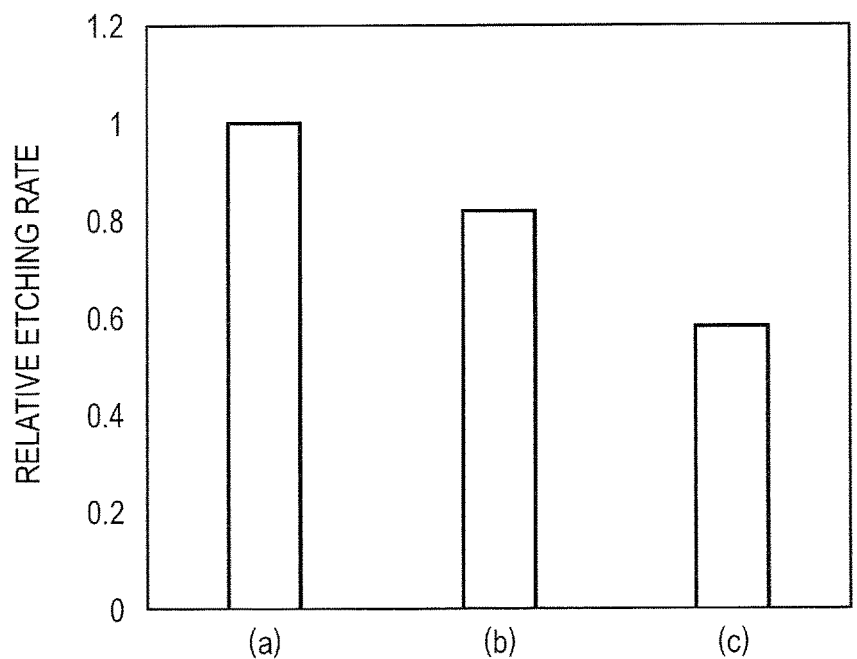
FIG. 23 is a graph illustrating a relative etching rate of an $O_3$-TEOS film of the semiconductor device of the first embodiment.

FIG. 23 is a graph showing a relative etching rate of the $O_3$-TEOS film. In the graph, (a) shows a sample before heat treatment, (b) shows a sample subjected to heat treatment at 400° C. for 3 hr in an oxygen ($O_2$) atmosphere, and (C) shows a sample subjected to heat treatment at 400° C. for 3 hr in a hydrogen peroxide ($H_2O_2$) atmosphere. Hydrogen peroxide and ammonia water are each used as an etching solution. It can be seen that each of the samples (b) and (c), which have been subjected to the heat treatment in the oxidizing atmosphere, has a wet etching rate lower (slower) than the sample (a) before heat treatment. In particular, the sample (c) has a wet etching rate, about ½ of that of the sample (a).

Figure 24:
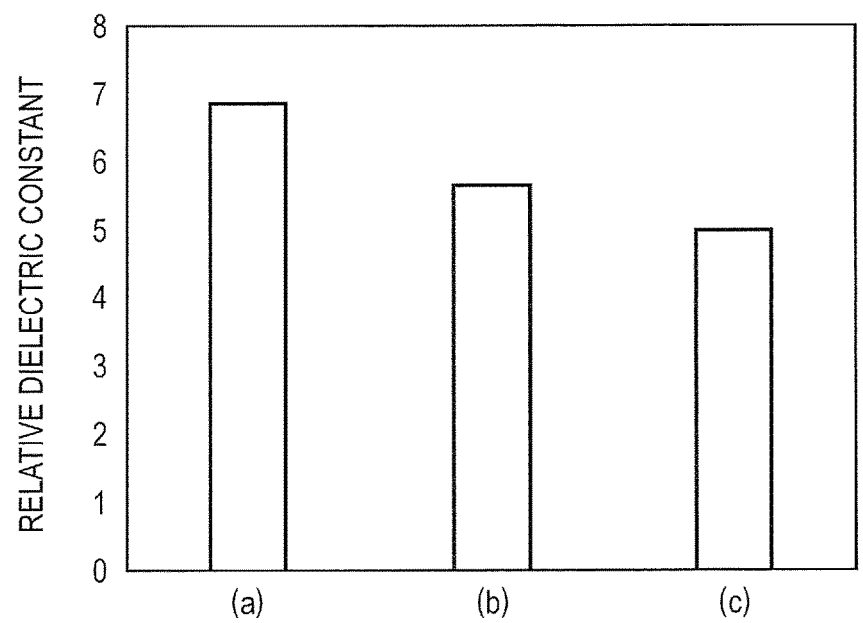
FIG. 24 is a graph illustrating a relative dielectric constant of the $O_3$-TEOS film of the semiconductor device of the first embodiment.

FIG. 24 is a graph illustrating a relative dielectric constant of the $O_3$-TEOS film. While the sample (a) before heat treatment has a relative dielectric constant of 7, the sample (b) subjected to heat treatment at 400° C. for 3 hr has a decreased, relative dielectric constant of 5.5. The sample (c) subjected to heat treatment at 400° C. for 3 hr in a hydrogen peroxide ($H_2O_2$) atmosphere has a further decreased, relative dielectric constant of 5 or less.

The average radius in each sample film has been measured by a positron annihilation method. As a result, it has been found that the radius is 0.301 nm for the sample (a), 0.287 nm for the sample (b), and 0.279 nm for the sample (c). The inventors of this application believe that, the $O_3$-TEOS film is subjected to heat treatment in an oxidizing atmosphere, thereby a dehydration condensation reaction occurs, and thus a proportion of silanol groups in the film decreases while a proportion of siloxane groups increases. In addition, the $O_3$-TEOS film itself shrinks and hardens through the dehydration condensation reaction, leading to low (slow) wet etching rate. In addition, the relative dielectric constant is reduced by an increase in the radius (volume) of each micropore due to contraction of the $O_3$-TEOS film.

Specifically, it is important that the $O_3$-TEOS film is subjected to heat treatment in an oxidizing atmosphere after the formation of the $O_3$-TEOS film and before a subsequent step (polishing (CMP treatment) of Step S20 of FIG. 2).

Figure 16:
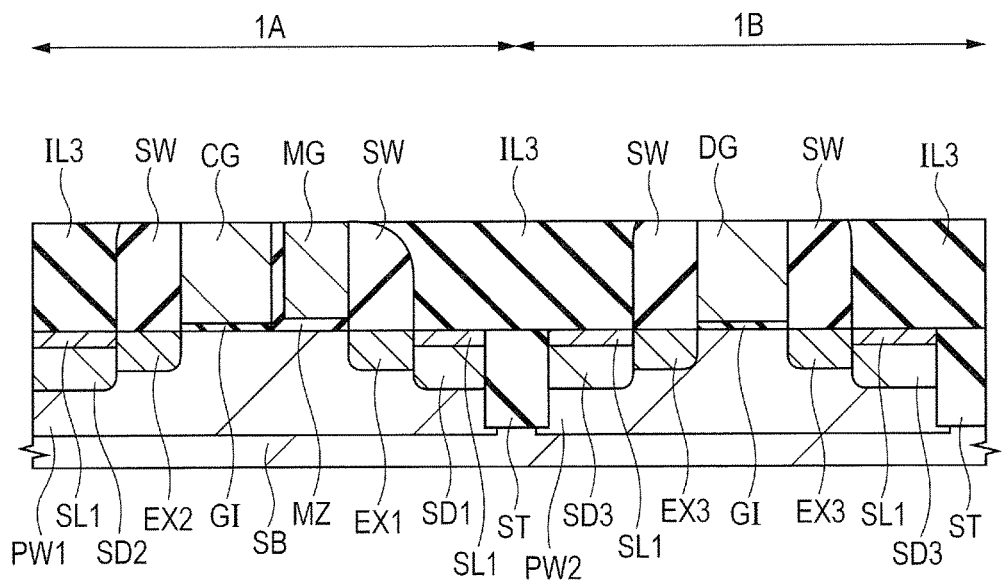
FIG. 16 is a major-part sectional view of the semiconductor device during the manufacturing process following FIG. 15.

Subsequently, the top of the insulating film IL3 is polished by a CMP process or the like (Step S20 of FIG. 2). As shown in FIG. 16, tops of the control gate electrode CG, the memory gate electrode MG, and the gate electrode DG are exposed through the polishing step of Step S20. That is, the cap insulating films CP1 and CP2 formed on the control gate electrode CG and the gate electrode DG, respectively, are completely removed through the polishing step of Step S20. It will be appreciated that the sidewalls SW located on the sidewalls of the cap insulating films CP1 and CP2 are each also partially removed. The silicide layer SL1 formed in the upper portion of the memory gate electrode MG is also removed.

As described above, the insulating film IL3 including the $O_3$-TEOS film subjected to heat treatment in the oxidizing atmosphere is hardened and has a low wet etching rate as compared with immediately after deposition. It is therefore possible to reduce or prevent lowering of the top of the insulating film IL3 with respect to the tops of the control gate electrode CG, the memory gate electrode MG, and the gate electrode DG in the polishing step (Step S20 of FIG. 2). That is, dishing of the insulating film IL3 can be reduced.

Figure 17:
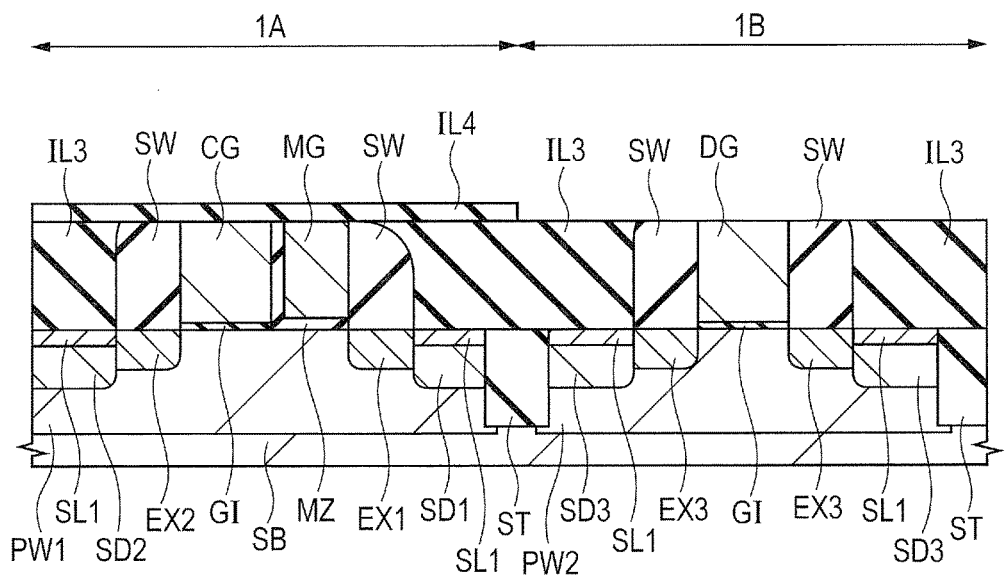
FIG. 17 is a major-part sectional view of the semiconductor device during the manufacturing process following FIG. 16.

Subsequently, as shown in FIG. 17, an insulating film IL4 having a predetermined pattern is formed over the semiconductor substrate SB (Step S21 of FIG. 3).

The insulating film IL4 includes, for example, a silicon nitride film, and can be formed by a CVD process or the like. The insulating film IL4 has a pattern in planar view, the pattern covering the entire memory cell region 1A but exposing the gate electrode DG in the peripheral circuit region 1B. In other words, the insulating film IL4 has a pattern that covers the control gate electrode CG and the memory gate electrode MG but exposes the gate electrode DG.

Subsequently, the gate electrode DG is removed by etching (Step S22 of FIG. 3). The etching of Step S22 is performed through, for example, wet etching using ammonia water so that silicon is selectively etched. As described above, since the insulating film IL3 including the $O_3$-TEOS film has a low wet etching rate, it is possible to reduce or prevent lowering of the top of the insulating film IL3 in the wet etching step of removing the gate electrode DG.

Since the gate electrode DG is removed in Step S22, a trench (recess, dish) TR1 is formed in the polished insulating film IL3 (including the sidewall spacer SW). The trench TR1 corresponds to a region from which the gate electrode DG has been removed, i.e., a region that the gate electrode DG has occupied until being removed. The bottom (bottom face) of the trench TR1 is formed by the top of the insulating film GI, and sidewalls (side faces) of the trench TR1 are formed by side faces of the sidewall spacer SW (side faces that have been in contact with the gate electrode DG until removal of the gate electrode DG).

In Step S22, i.e., in the step of removing the gate electrode DG, etching is preferably performed under a condition that the insulating film IL4, the insulating film IL3, the insulating film GI, and the sidewall spacer SW are less likely to be etched than the gate electrode DG. In other words, the etching is preferably performed under the condition that etching rate of each of the insulating film IL4, the insulating film IL3, the insulating film GI, and the sidewall spacer SW is smaller than etching rate of the gate electrode DG. Consequently, the gate electrode DG can be selectively etched. Since the insulating film IL4 covers the entire memory cell region 1A, the memory gate electrode MG and the control gate electrode CG are not etched in Step S22.

Figure 18:
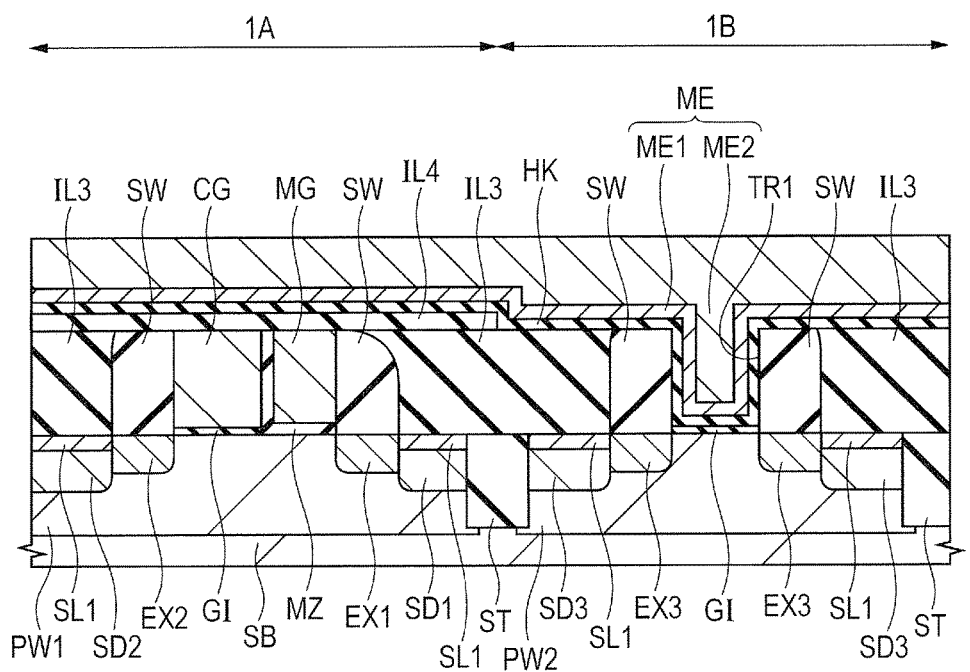
FIG. 18 is a major-part sectional view of the semiconductor device during the manufacturing process following FIG. 17.

Subsequently, as shown in FIG. 18, an insulating film HK is formed over the semiconductor substrate SB, i.e., on the insulating film IL3 including the inside (over the bottom and the sidewalls) of the trench TR1 (Step S23 of FIG. 3). Subsequently, a metal film ME is formed as a conductive film over the semiconductor substrate SB, i.e., on the insulating film HK so as to fill the trench TR1 (Step S24 of FIG. 3).

Although the insulating film HK is formed over the bottom (bottom face) and the sidewalls (side faces) of the trench TR1 in Step S23, the trench TR1 is not completely filled with the insulating film HK. After the metal film ME is formed in Step S24, the trench TR1 is completely filled with the insulating film HK and the metal film ME.

The insulating film HK is an insulating film to form a gate insulating film, and the metal film ME is a conductive film to form a gate electrode. Specifically, the insulating film HK is an insulating film to form the gate insulating film of the MISFET formed in the peripheral circuit region 1B, and the metal film ME is a conductive film to form the gate electrode of the MISFET formed in the peripheral circuit region 1B.

The insulating film HK is an insulating material film having a dielectric constant (relative dielectric constant) higher than silicon nitride, i.e., a so-called high-k film (high dielectric constant film). In this application, when referring to a high-k film, a high dielectric constant film, or a high dielectric constant gate insulating film, the film means a film having a dielectric constant (relative dielectric constant) higher than silicon nitride.

A metal oxide film such as a hafnium oxide film, a zirconium oxide film, an aluminum oxide film, a tantalum oxide film, or a lanthanum oxide film can be used as the insulating film HK. Such a metal oxide film may further contain one or both of nitrogen (N) and silicon (Si). The insulating film HK can be formed by, for example, an atomic layer deposition (ALD) process or a CVD process. When a high dielectric constant film (in this case, the insulating film HK) is used for the gate insulating film, physical thickness of the gate insulating film can be increased as compared with the case of using the silicon oxide film; hence, leakage current can be advantageously reduced.

A metal film can be used as the metal film ME, the metal film including, for example, a tantalum nitride (TaN) film, a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, a titanium aluminum (TiAl) film, or an aluminum (Al) film. The metal film as used herein refers to a conductive film showing metallic conduction, and includes not only a simple metal film (pure metal film) or an alloy film but also a metal compound film (such as a metal nitride film or a metal carbide film) showing metallic conduction. The metal film ME is therefore a conductive film showing metallic conduction, and may be a metal compound film (such as a metal nitride film or a metal carbide film) showing metallic conduction without being limited to the simple metal film (pure metal film) or the alloy film. The metal film ME may be formed as a stacked film (stacked film including a plurality of films being stacked). In such a case, the lowermost layer of the stacked film is a metal film (a conductive film showing metallic conduction). Further, the stacked film may be a stacked film of a plurality of metal films (conductive films showing metallic conduction). The metal film ME can be formed by a sputtering process, for example.

FIG. 18 shows a preferred example of the metal film ME, in which the metal film ME is a stacked film of a titanium aluminum (TiAl) film ME1 and an aluminum (Al) film ME2 on the titanium aluminum film ME1. In such a case, in Step S24, the titanium aluminum film ME1 is first formed on the insulating film HK, and then the aluminum film ME2 is formed on the titanium aluminum film ME1 so as to fill the trench TR1. At this time, the aluminum film ME2 is preferably made thicker than the titanium aluminum film ME1. Since the aluminum film ME2 has a low resistance, it is possible to reduce a resistance of the gate electrode GE formed later. A threshold voltage of the MISFET having the gate electrode GE formed later can be controlled by a work function of a material of a portion (in this case, the titanium aluminum film ME1), which is in contact with the gate insulating film, of the gate electrode GE. A titanium (Ti) film, a titanium nitride (TiN) film, or a stacked film thereof may be interposed between the titanium aluminum film ME1 and the aluminum film ME2 in light of improving adhesion. In such a case, after the titanium aluminum film ME1 is formed, a titanium film, a titanium nitride film, or a stacked film thereof is formed on the titanium aluminum film ME1, and then the aluminum film ME2 is formed on such a film.

Figure 19:
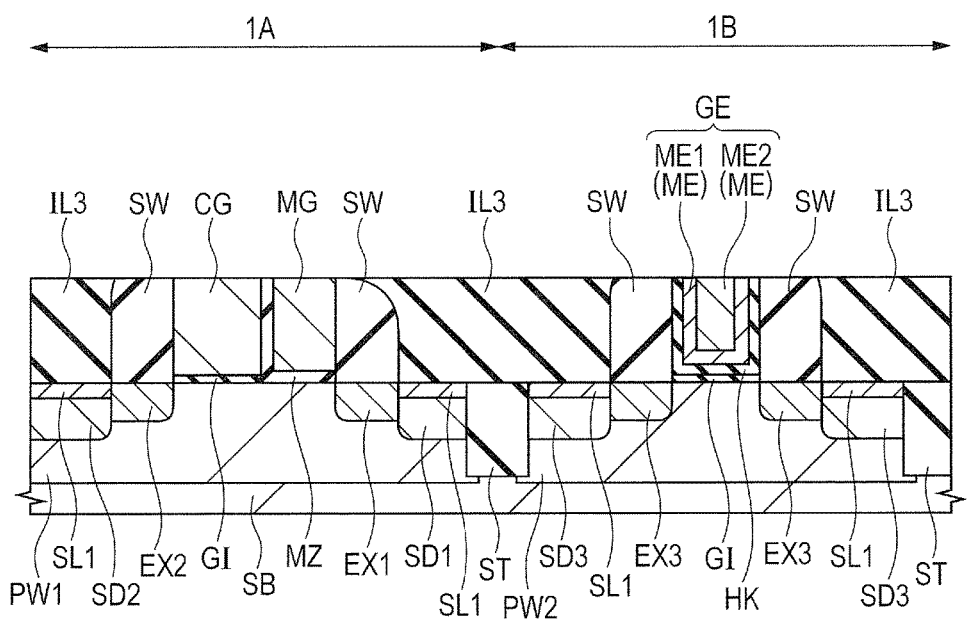
FIG. 19 is a major-part sectional view of the semiconductor device during the manufacturing process following FIG. 18.

Subsequently, as shown in FIG. 19, the unnecessary metal film ME and the unnecessary insulating film HK outside the trench TR1 are removed through polishing by a CMP process or the like, thereby the insulating film HK and the metal film ME are left in the trench TR1 and thus the gate electrode GE is formed (Step S25 of FIG. 3).

That is, in Step S25, the metal film ME and the insulating film HK outside the trench TR1 are removed while the insulating film HK and the metal film ME are left in the trench TR1. Consequently, the insulating film HK and the metal film ME are left and embedded in the trench TR1.

The metal film ME embedded in the trench TR1 serves as the gate electrode GE of the MISFET, the insulating film HK embedded in the trench TR1 serves as the gate insulating film of the MISFET, and the gate electrode GE serves as the gate electrode of the MISFET.

Since the gate electrode GE is formed using the metal film ME, the gate electrode GE can be formed as a metal gate electrode. The gate electrode GE is formed as the metal gate electrode, thereby a depletion phenomenon of the gate electrode GE can be suppressed, advantageously leading to a reduction in parasitic capacitance and speedup of the MISFET.

The insulating film HK is formed on the bottom (bottom face) and the sidewall of the trench TR1, and the bottom (bottom face) and the sidewalls (side faces) of the gate electrode GE are in contact with the insulating film HK. The insulating film GI and the insulating film HK are interposed between the gate electrode GE and the semiconductor substrate SB (p-well PW2), and the insulating film HK is interposed between the gate electrode GE and the sidewall spacer SW. The insulating films GI and HK directly under the gate electrode GE each serve as a gate insulating film of the MISFET. The insulating film HK, which has a high dielectric constant, serves as a high dielectric constant gate insulating film.

In Step S25, the insulating film IL4 can also be polished and removed by a CMP process or the like. Hence, when the step S25 is performed, the metal film ME and the insulating film HK are also removed from over the memory gate electrode MG and the control gate electrode CG, and the insulating film IL4 is also removed therefrom; hence, the top of the memory gate electrode MG and the top of the control gate electrode CG are exposed.

In another possible embodiment, the gate electrode DG is etched in Step S22, and then the insulating film GI on the bottom of the trench TR1 is removed before forming the insulating film HK in Step S23. In such a case, more preferably, the insulating film GI on the bottom of the trench TR1 is removed, and then an interface layer including a silicon oxide film or a silicon oxynitride film is formed on the surface of the semiconductor substrate SB (p-well PW2) exposed from the bottom of the trench TR1, and then the insulating film HK is formed in Step S23. In that case, the interface layer including the silicon oxide film or the silicon oxynitride film is interposed (at an interface) between the insulating film HK and the semiconductor substrate SB (p-well PW2) in the peripheral circuit region 1B.

When Step S25 of FIG. 3 is completed, the tops of the control gate electrode CG, the memory gate electrode MG, the gate electrode GE, and the insulating film IL3 have the same height from the top of the semiconductor substrate SB or from the top of the element isolation film ST. The respective tops (upper ends) of the sidewall spacers SW formed on the sidewalls of the control gate electrode CG, the memory gate electrode MG, and the gate electrode GE also have the same height as each of the heights of the control gate electrode CG and others.

Figure 20:
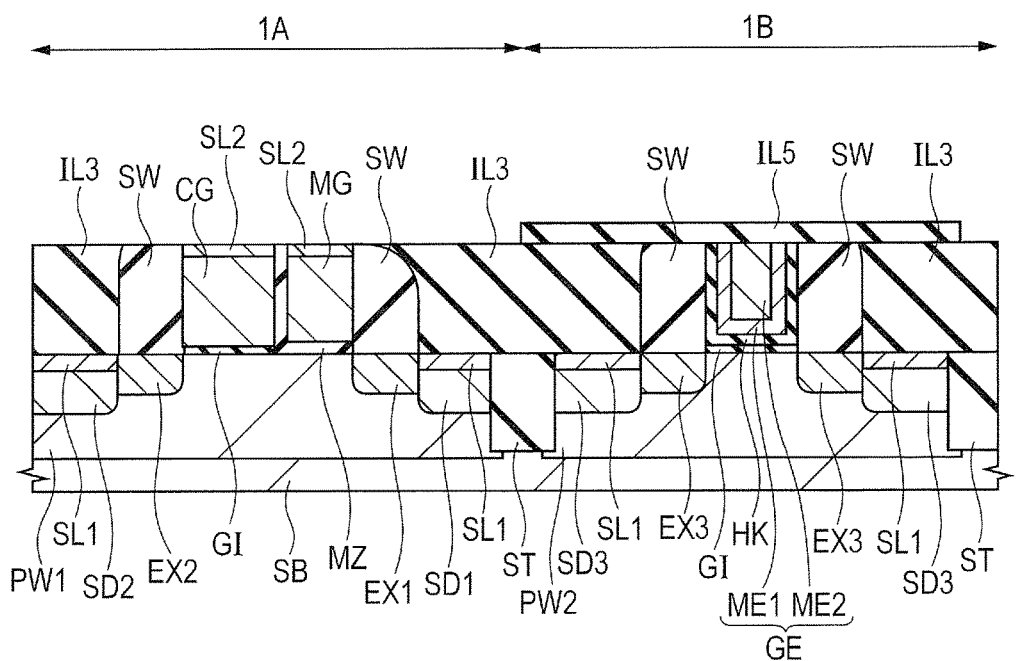
FIG. 20 is a major-part sectional view of the semiconductor device during the manufacturing process following FIG. 19.

Subsequently, as shown in FIG. 20, an insulating film IL5 having a predetermined pattern is formed over the semiconductor substrate SB (Step S26 of FIG. 3).

The insulating film IL5 includes, for example, a silicon oxide film, and can be formed by a CVD process or the like. The insulating film IL5 has a pattern (planar shape) in planar view, which covers the entire peripheral circuit region 1B but exposes the memory cell region 1A. In other words, the insulating film IL5 has a pattern that covers the gate electrode GE of the MISFET but exposes the tops of the control gate electrode CG and the memory gate electrode MG.

Subsequently, as shown in FIG. 20, a silicide layer SL2 is formed on the memory gate electrode MG and on the control gate electrode CG (Step S27 of FIG. 3). The silicide layer SL2 can be formed as follows.

First, a metal film is formed (deposited) over the semiconductor substrate SB. The metal film can be a simple metal film (pure metal film) or an alloy film, and preferably includes a cobalt (Co) film, a nickel (Ni) film, or a nickel-platinum alloy film (platinum-added nickel film). The nickel film is particularly preferred. The metal film can be formed by a sputtering process or the like.

Since the metal film is formed over the entire main surface of the semiconductor substrate SB, the metal film is also formed on the tops (surfaces) of the memory gate electrode MG and the control gate electrode CG. Formation of the metal film therefore results in a state where the tops (surfaces) of the memory gate electrode MG and the control gate electrode CG are in contact with the metal film. On the other hand, in the peripheral circuit region 1B, since the metal film is formed on the insulating film IL5, the formed metal film is not in contact with the gate electrode GE while the insulating film IL5 is interposed between the gate electrode GE and the metal film.

Subsequently, heat treatment is performed on the semiconductor substrate SB so that upper layer portions (surface layer portions) of the memory gate electrode MG and the control gate electrode CG are each reacted with the metal film. Consequently, as shown in FIG. 20, the silicide layer SL2 is formed in each of the upper portions (tops, surfaces, or upper layer portions) of the memory gate electrode MG and the control gate electrode CG. The silicide layer SL2 may preferably be a cobalt silicide layer (for the metal film including cobalt), a nickel silicide layer (for the metal film including nickel), or a platinum-added nickel silicide layer (for the metal film including nickel-platinum alloy). Subsequently, the unreacted metal film is removed by wet etching or the like. FIG. 20 shows a sectional view at this stage. Further heat treatment may be performed after removing the unreacted metal film. The silicide layer SL2 is not formed on the gate electrode GE.

In this way, the silicide layer SL2 is formed in each of the upper portions of the memory gate electrode MG and the control gate electrode CG in the memory cell region 1A by performing a so-called salicide process. This makes it possible to reduce a resistance of the memory gate electrode MG and a resistance of the control gate electrode CG. Use of the salicide process makes it possible to form the silicide layer SL2 in a self-alignment manner on each of the memory gate electrode MG and the control gate electrode CG. In addition, the silicide layer SL2 can be formed over substantially the entire tops of the memory gate electrode MG and the control gate electrode CG.

In this exemplary case, the silicide layer SL2 is formed on the surfaces of the control gate electrode CG and the memory gate electrode MG as shown in FIG. 20. In other words, the control gate electrode CG has a stacked structure of the silicon film PS1 and the silicide layer SL2, and the memory gate electrode MG has a stacked structure of the silicon film PS2 and the silicide layer SL2.

Figure 21:
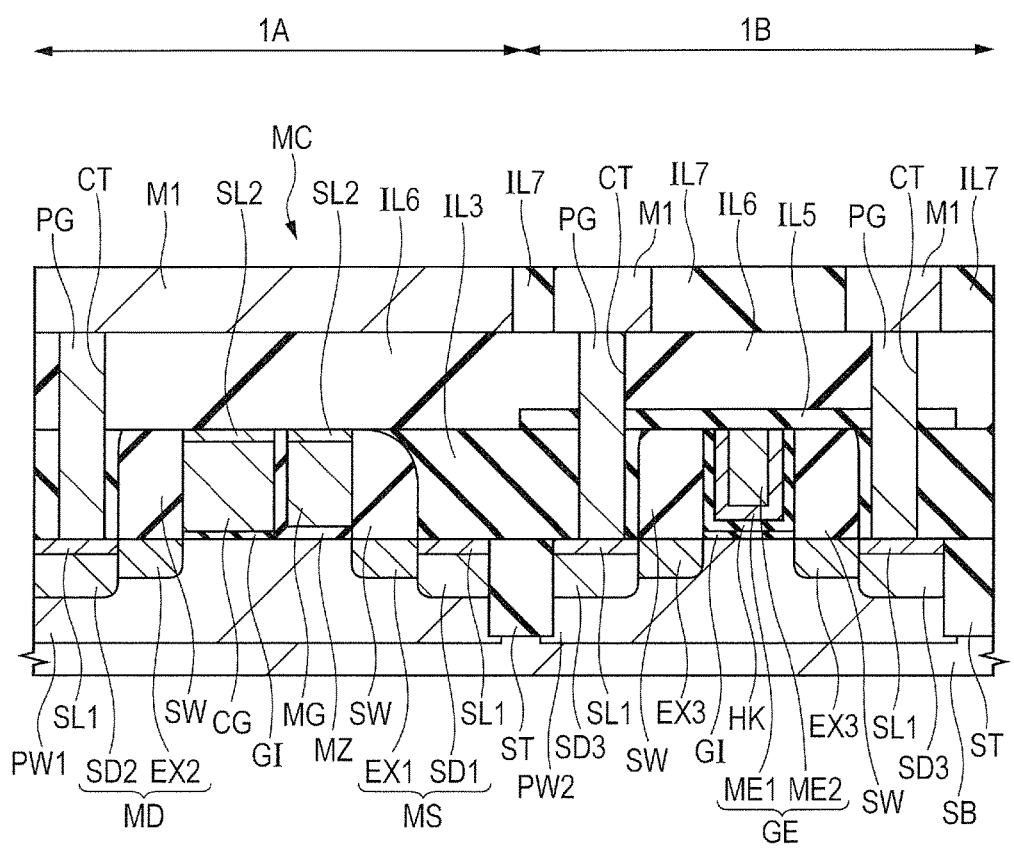
FIG. 21 is a major-part sectional view of the semiconductor device during the manufacturing process following FIG. 20.
Figure 22:
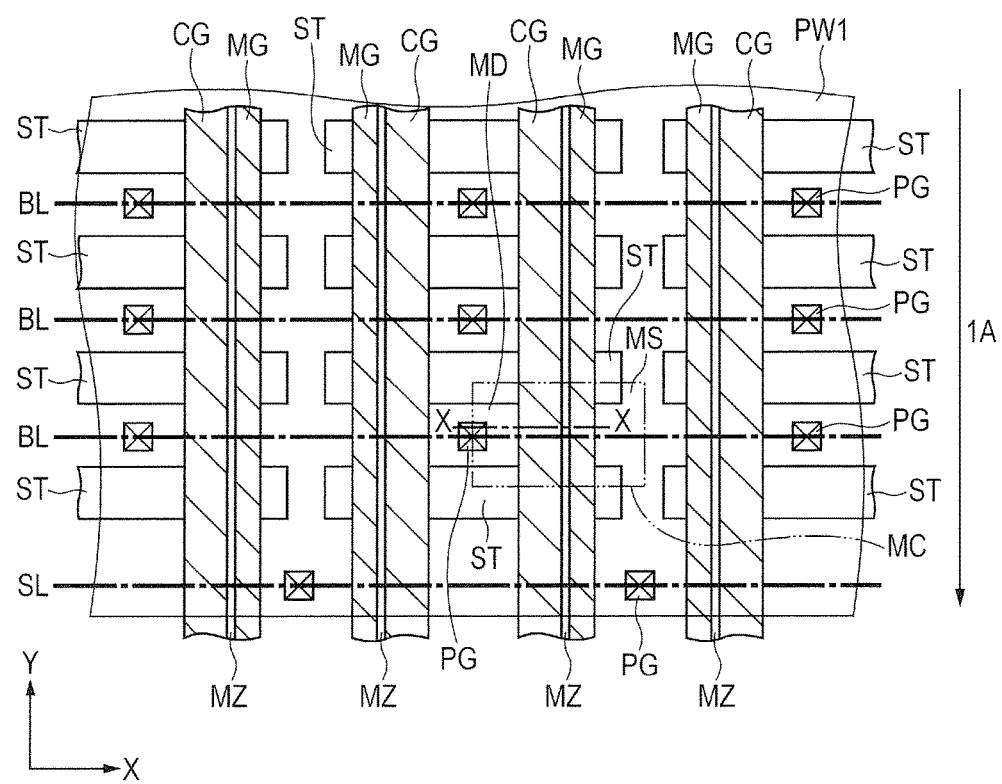
FIG. 22 is a major-part plan view of the semiconductor device of the first embodiment.

Subsequently, as shown in FIG. 21, an insulating film (interlayer insulating film) IL6 is formed over the entire main surface of the semiconductor substrate SB (Step S28 of FIG. 3).

The insulating film IL6 is formed on the insulating film IL5 in a region having the insulating film IL5 (for example, the peripheral circuit region 1B) while being formed mainly on the insulating film IL3 in a region having no insulating film IL5. In addition, the insulating film IL6 is formed so as to cover the silicide layer SL2 on each of the memory gate electrode MG and the control gate electrode CG in the memory cell region 1A. For example, a silicon oxide-based insulating film mainly including silicon oxide can be used as the insulating film IL6.

After formation of the insulating film IL6, a top of the insulating film IL6 is polished by a CMP process to improve flatness of the top of the insulating film IL6.

In the first embodiment, the insulating film IL6 is formed without removing the insulating film IL5. This allows the manufacturing process of the semiconductor device to be simplified. In another possible embodiment, the silicide layer SL2 is formed in Step S27, and then the insulating film IL5 is removed before the insulating film IL6 is formed in Step S28.

Subsequently, an undepicted photoresist pattern, which is formed on the insulating film IL6 by a photolithography process, is used as an etching mask to dry-etch the insulating films IL6, IL5, and IL3, thereby contact holes (openings, through-holes) CT are formed in the insulating films IL6, IL5, and IL3 (Step S29 of FIG. 3).

In the region having the insulating film IL5 (for example, the peripheral circuit region 1B), the contact hole CT is formed so as to penetrate through a stacked film of the insulating film IL6, the insulating film IL5, and the insulating film IL3. In the memory cell region 1A having no insulating film IL5, the contact hole CT is formed so as to penetrate through the stacked film of the insulating film IL6 and the insulating film IL3.

Subsequently, as shown in FIG. 21, a conductive plug electrode PG made of tungsten (W) or the like is formed as a conductor portion for coupling in the contact hole CT (Step S30 of FIG. 3).

In order to form the plug electrode PG, for example, a barrier conductor film (for example, a titanium film, a titanium nitride film, or a stacked film thereof) is formed on the insulating film IL6 including the inside, i.e., over the bottom and the sidewalls, of the contact hole CT. Subsequently, a main conductor film including a tungsten film or the like is formed on the barrier conductor film so as to fill the contact hole CT, and then the unnecessary main conductor film and the unnecessary barrier conductor film outside the contact hole CT are removed by a CMP process, an etch back process, or the like, thereby the plug electrode PG can be formed. In FIG. 21, the barrier conductor film and the main conductor film (tungsten film) configuring the plug electrode PG are shown in an integrated manner for simplification of the drawing.

The contact hole CT and the plug electrode PG embedded in the contact hole CT are formed over the $n^+$ type semiconductor regions SD1, SD2, and SD3, over the control gate electrode CG, over the memory gate electrode MG, and over the gate electrode GE. At the bottom of the contact hole CT, there is exposed part of the main surface of the semiconductor substrate SB, for example, part of (the silicide layer SL1 on the surface of) the $n^+$ type semiconductor regions SD1, SD2, or SD3, part of (the silicide layer SL2 on the surface of) the control gate electrode CG, part of (the silicide layer SL2 on the surface of) of the memory gate electrode MG, or part of the gate electrode GE.

The sectional view of FIG. 21 shows the contact holes CT for the $n^+$ type semiconductor regions SD2 and SD3 and the plug electrodes PG filling such contact holes CT.

Subsequently, an interconnection (interconnection layer) M1 as a first-layer interconnection is formed on the insulating film IL6 in which the plug electrode PG is embedded (Step S31 of FIG. 3). A case where the interconnection M1 is formed using a damascene technique (in this case, a single damascene technique) is now described.

First, as shown in FIG. 21, an insulating film IL7 is formed on the insulating film IL6 in which the plug electrode PG is embedded. The insulating film IL7 may be formed of a stacked film of a plurality of insulating films. Subsequently, an interconnection trench (a trench for an interconnection) is formed in a predetermined region of the insulating film IL7 by dry etching with an undepicted photoresist pattern as an etching mask, and then a barrier conductor film (for example, a titanium nitride film, a tantalum film, a tantalum nitride film, or the like) is formed on the insulating film IL7 including over a bottom and sidewalls of the interconnection trench. Subsequently, a copper seed layer is formed on the barrier conductor film by a CVD process, a sputtering process, or the like, and then a copper plating film is formed on the seed layer by an electrolytic plating process or the like, so that the interconnection trench is filled with the copper plating film. Subsequently, the main conductor film (the copper plating film and the seed layer) and the barrier conductor film in a region other than the interconnection trench are removed by a CMP process to form the first-layer interconnection M1 including the copper embedded in the interconnection trench as a main conductive material. FIG. 21 shows the interconnection (metal interconnection) M1 in such a manner that the barrier conductor film, the seed layer, and the copper plating film are shown in an integrated manner for simplification of the drawing.

As shown in FIG. 21, the interconnection M1 is electrically coupled to the drain region (n+ type semiconductor region SD2) of the control transistor, or the source/drain region (n+ type semiconductor region SD3) of the MISFET in the peripheral circuit region 1B via the plug electrode PG. Subsequently, while not illustrated and described, interconnections (metal interconnections) of second and subsequent layers are formed by a dual damascene process or the like. Each of the interconnection M1 and interconnections in upper layers is not limited to the damascene interconnection, and can be formed by patterning a conductor film for an interconnection. For example, such interconnections may each be a tungsten interconnection or an aluminum interconnection.

In this way, the semiconductor device of the first embodiment is manufactured.

Structure of Semiconductor Device

A configuration of the memory cell of the nonvolatile memory of the semiconductor device of the first embodiment is now described with reference to FIGS. 21 and 22.

FIG. 22 is a major-part plan view of the memory cell region of the semiconductor device of the first embodiment. FIG. 21 includes a major-part sectional view of the memory cell region 1A along a line X-X in FIG. 22.

A structure of the memory cell region 1A is described with reference to FIGS. 21 and 22.

As shown in FIG. 21, memory cells MC, which each include a nonvolatile memory including the memory transistor and the control transistor, are formed over the semiconductor substrate SB. In each memory cell MC, a MISFET, which has the gate insulating film including the charge accumulating part (charge accumulating layer) and the memory gate electrode MG, is referred to as memory transistor, and a MISFET having the gate insulating film and the control gate electrode CG is referred to as control transistor.

As shown in FIG. 21, the memory cell MC of the nonvolatile memory includes the n type semiconductor regions MS and MD for the source and the drain formed in the p-well PW1 of the semiconductor substrate SB, the control gate electrode CG formed over the semiconductor substrate SB (p-well PW1), and the memory gate electrode MG that is formed over the semiconductor substrate SB (p-well PW1) and adjacent to the control gate electrode CG. The memory cell MC of the nonvolatile memory further includes the insulating film (gate insulating film) GI formed between the control gate electrode CG and the semiconductor substrate SB (p-well PW1) and the insulating film MZ formed between the memory gate electrode MG and the semiconductor substrate SB (p-well PW1).

The control gate electrode CG and the memory gate electrode MG are arranged side by side while the insulating film MZ is interposed between their opposing side faces, and extend along the main surface of the semiconductor substrate SB. The extending direction of each of the control gate electrode CG and the memory gate electrode MG is a vertical direction of a paper plane of FIG. 21 (Y direction in FIG. 22). The control gate electrode CG and the memory gate electrode MG are formed over the semiconductor substrate SB (p-well PW1) between the semiconductor regions MS and MD while the respective insulating films GI and MZ are disposed in between, where the memory gate electrode MG is located on a side close to the semiconductor region MS, and the control gate electrode CG is located on a side close to the semiconductor region MD. The control gate electrode CG is provided over the semiconductor substrate SB with the insulating film GI in between, while the memory gate electrode MG is provided over the semiconductor substrate SB with the insulating film MZ in between.

The control gate electrode CG and the memory gate electrode MG are adjacent to each other with the insulating film MZ in between. The insulating film MZ extends over both the region between the memory gate electrode MG and the semiconductor substrate SB (p-well PW1) and the region between the memory gate electrode MG and the control gate electrode CG.

The semiconductor region MS and the semiconductor region MD are semiconductor regions for the source and the drain, respectively. Specifically, the semiconductor region MS for the source includes the n− type semiconductor region EX1 (extension region) and the n+ type semiconductor region SD1 (source region) having an impurity concentration higher than the n− type semiconductor region EX1. The semiconductor region MD for the drain includes the n− type semiconductor region EX2 (extension region) and the n+ type semiconductor region SD2 (drain region) having an impurity concentration higher than the n− type semiconductor region EX2.

The silicide layer SL1 is provided in each of the upper portions of the n+ type semiconductor regions SD1 and SD2 by a salicide technique or the like. The silicide layer SL2 is provided by a salicide technique or the like in each of the upper portions of the memory gate electrode MG and the control gate electrode CG.

As shown in FIG. 22, a plurality of memory cells MC are arranged in a matrix in X and Y directions in the memory cell region 1A, and each memory cell MC is electrically isolated by the adjacent element isolation films ST in the Y direction. Two memory cells MC adjacent to each other in the X direction share the semiconductor region MD for a common drain, and the semiconductor region MD for the common drain is coupled to the bit line BL, which extends in the X direction, via the plug electrode PG. The bit line BL is configured of, for example, the first-layer interconnection M1. The semiconductor region MS for the source, which is disposed on a side opposite to the semiconductor region MD for the common drain with respect to the control gate electrode CG and the memory gate electrode MG, is continuously provided in the Y direction, and is coupled to a source line SL via the plug electrode PG at the end of the memory cell 1A. The source line SL is configured of, for example, the first-layer interconnection M1 and extends in the X direction.

The control gate electrode CG is provided in common (in one) for the memory cells MC arranged in the Y direction, and extends in the Y direction. The memory gate electrode MG is provided in common (in one) for the memory cells MC arranged in the Y direction, and extends in the Y direction.

The two memory cells MC adjacent in the X direction are disposed axisymmetrically with respect to a virtual line extending in the Y direction passing through the semiconductor region MS or the semiconductor region MD. Hence, the two memory gate electrodes MG or the two control gate electrodes CG of the two adjacent memory cells MC are adjacent to each other across the semiconductor region MS or the semiconductor region MD.

It is necessary to narrow an interval between the two adjacent memory gate electrodes MG or between the two control gate electrodes CG in order to reduce a size of the memory cell region 1A, i.e., a size of the semiconductor device. Although a space between the two adjacent memory gate electrodes MG and a space between the two control gate electrodes CG are each filled with the insulating film IL3 as shown in FIG. 21, since an aspect ratio of each space is increased due to the size reduction of the memory cell region 1A, the $O_3$-TEOS film having a good gap filling characteristic is used as the insulating film IL3. In addition, the sidewall spacer SW formed on each of the sidewalls of the control gate electrode CG and the memory gate electrode MG increases the aspect ratio of the space.

Main Characteristics and Effects

The main characteristics and effects of the first embodiment are now described.

The method of manufacturing the semiconductor device of the first embodiment includes the following steps.

In the memory cell region 1A of the semiconductor substrate SB, there is provided the memory cell that includes the control gate electrode CG formed on the main surface of the semiconductor substrate SB with the insulating film GI in between, the memory gate electrode MG formed on the main surface of the semiconductor substrate SB with the insulating film MZ, which includes the charge accumulating region, in between, and the semiconductor regions EX1 and SD1 and the semiconductor regions EX2 and SD2 formed in the main surface of the semiconductor substrate SB so as to sandwich the control gate electrode CG and the memory gate electrode MG. In the peripheral circuit region 1B of the semiconductor substrate SB, there is provided the MISFET that includes the gate electrode DG formed on the main surface of the semiconductor substrate SB with the insulating film GI in between, and the semiconductor regions EX3 and SD3 and the semiconductor regions EX3 and SD3 formed in the main surface of the semiconductor substrate SB so as to sandwich the gate electrode DG therebetween.

Subsequently, the insulating film IL3 including the $O_3$-TEOS film is formed at a first temperature over the main surface of the semiconductor substrate SB so as to cover the memory cell and the MISFET.

Subsequently, the insulating film IL3 is heat-treated at a second temperature in an oxidizing atmosphere.

Subsequently, the first polishing is performed on the insulating film IL3 to expose the tops of the control gate electrode CG, the memory gate electrode MG, and the gate electrode DG.

Subsequently, the gate electrode DG is removed to form the trench TR1 in the insulating film IL3 in the peripheral circuit region 1B.

Subsequently, the metal film ME is formed on the insulating film IL3 so as to fill the trench TR1.

Subsequently, the second polishing is performed on the metal film ME to selectively leave the metal film ME in the trench TR1, thereby the gate electrode GE of the MISFET is formed in the trench TR1.

According to the above-described manufacturing method, the $O_3$-TEOS film having a high gap filling characteristic is used for filling between the adjacent control gate electrodes CG and between the adjacent memory gate electrodes MG in the memory cell region 1A, and for filling between the adjacent gate electrodes DG in the peripheral circuit region 1B. This makes it possible to reduce or prevent formation of "seam" in the insulating film IL3 between the adjacent control gate electrodes CG, between the adjacent memory gate electrodes MG, and between the adjacent gate electrodes DG.

As shown in FIG. 22, a plurality of plug electrodes PG coupled to the bit line BL are arranged at a predetermined interval in the Y direction between the adjacent control gate electrodes CG. Formation of "seam" in the insulating film IL3 may cause short circuit between the plug electrodes PG adjacent in the Y direction. In the first embodiment, however, the $O_3$-TEOS film having a high gap filling characteristic is provided between the adjacent control gate electrodes CG, which makes it possible to prevent the short circuit between the plug electrodes PG.

The insulating film IL3 is subjected to heat treatment in an oxidizing atmosphere, which allows the heat treatment temperature (second temperature) of the insulating film IL3 to be lower than the film formation temperature (first temperature) of the insulating film IL3. This makes it possible to reduce or prevent deterioration in characteristics of the memory cell or the MISFET. For example, if the heat treatment temperature (second temperature) is higher than the film formation temperature (first temperature), the silicide layer SL1 formed on each of the tops of the semiconductor regions SD1, SD2, and SD3 grows during the heat treatment step, leading to an increase in leakage current between the semiconductor region SD1 or SD2 and the P-well region PW1 and between the semiconductor region SD3 and the P-well region PW2. However, in the first embodiment, since the heat treatment temperature (second temperature) can be set to be lower, the leakage current can be decreased. Furthermore, since the heat treatment temperature (second temperature) can be set to be lower, a nickel silicide layer or a platinum-containing nickel silicide layer can be used as the silicide layer SL1.

The $O_3$-TEOS film having the ratio of the silanol (Si—O—H) groups to the siloxane (Si—O—Si) groups of 10% or more is used to cover the memory cell and the MISFET, thereby the gap filling characteristic can be improved.

The $O_3$-TEOS film is formed and then subjected to heat treatment, thereby the relative dielectric constant of the insulating film IL3 ($O_3$-TEOS film) can be reduced, and thus parasitic capacitance of the control gate electrode CG, the memory gate electrode MG, or the bit line BL can be reduced, leading to high-speed operation of the memory cell MC.

The insulating film IL3 is subjected to heat treatment before the first polishing step and the step of removing the gate electrode DG, thereby the wet etching rate of the insulating film IL3 can be reduced. It is therefore possible to reduce dishing (occurrence of a dish) of the insulating film IL3 and scraping of the surface of the insulating film IL3 in the step of removing the gate electrode DG in the first polishing step. In the second polishing step performed on the metal film ME, therefore, it is possible to reduce or prevent short circuit between the adjacent gate electrodes GE in the peripheral circuit region 1B due to the metal film ME remaining on the dished portion or the scraped portion of the insulating film IL3.

Second Embodiment

A second embodiment is a modification of the first embodiment. The second embodiment is different from the first embodiment in that the memory cell and the MISFET are formed on a semiconductor substrate having a fin-type element formation region (active region). Hence, the same reference numerals are given to portions common to the first embodiment.

Figure 25:
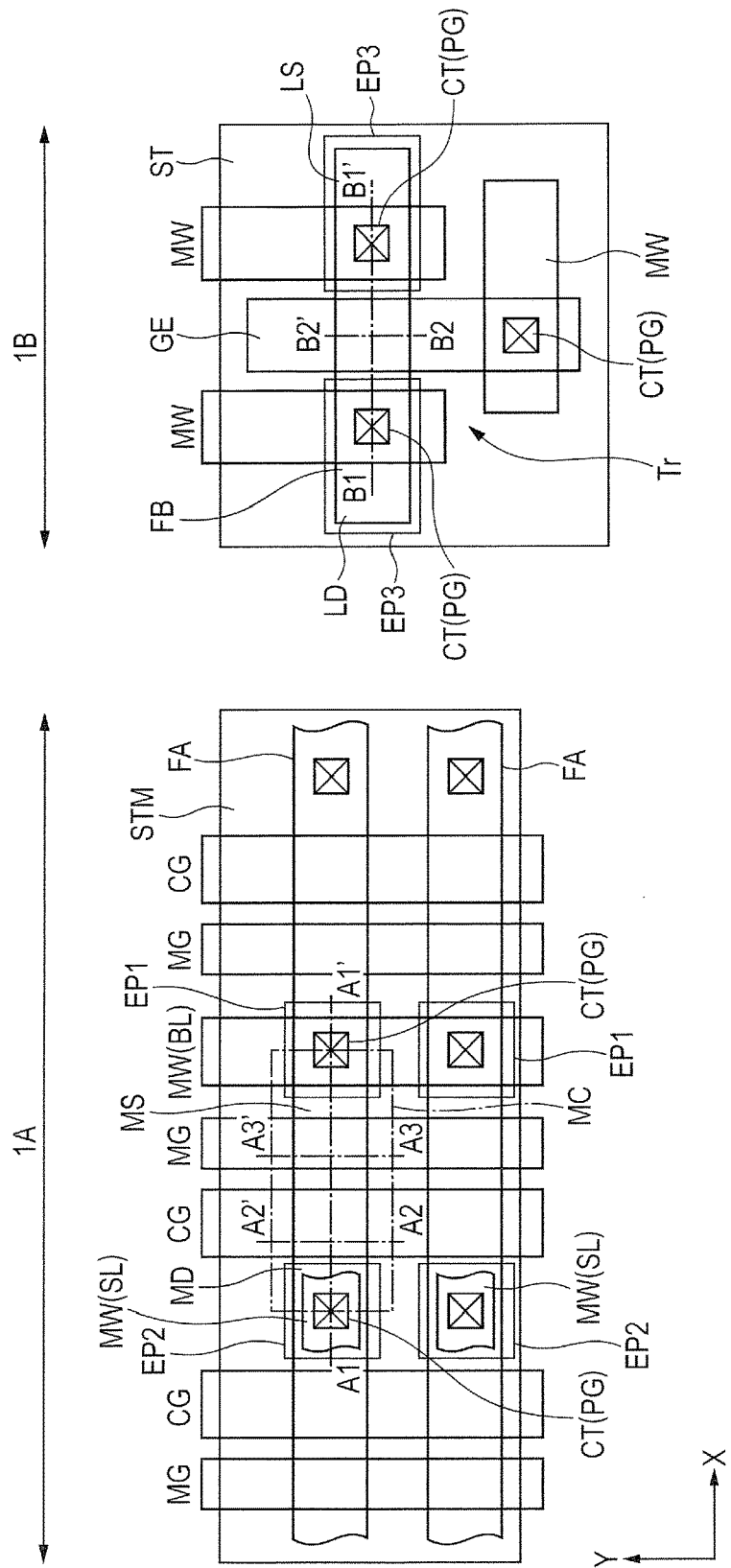
FIG. 25 is a major-part plan view of a semiconductor device of a second embodiment.
Figure 26:
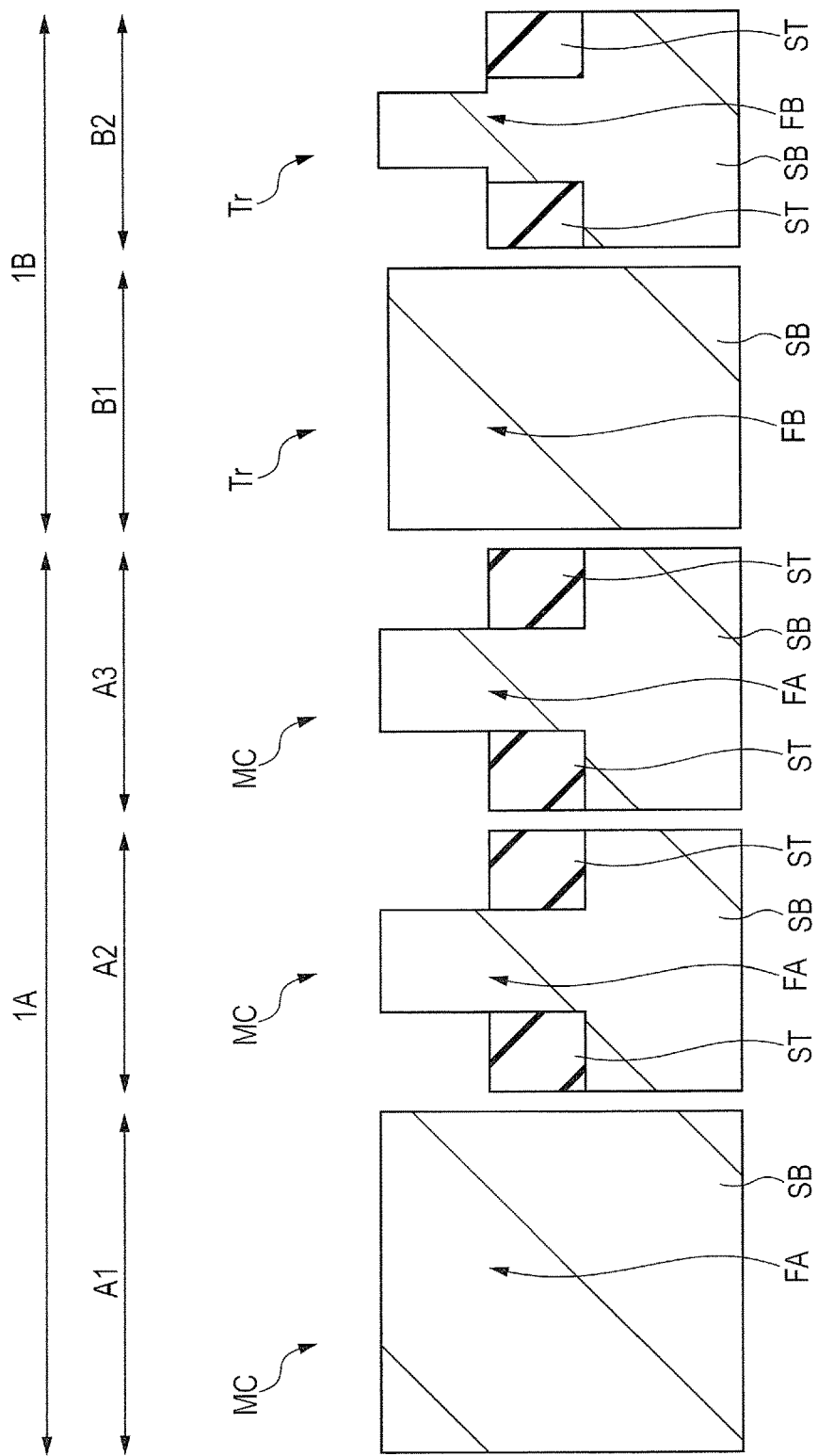
FIG. 26 is a major-part sectional view of the semiconductor device of the second embodiment during a manufacturing process of the semiconductor device, which corresponds to FIG. 4 of the first embodiment.

FIG. 25 is a major-part plan view of a semiconductor device of the second embodiment. FIGS. 26 to 31 are each a major-part sectional view of the semiconductor device of the second embodiment during a manufacturing process of the semiconductor device. FIG. 26 corresponds to FIG. 4 of the first embodiment, FIG. 27 corresponds to FIG. 14 of the first embodiment, FIG. 28 corresponds to FIG. 15 of the first embodiment, FIG. 29 corresponds to FIG. 16 of the first embodiment, FIG. 30 corresponds to FIG. 19 of the first embodiment, and FIG. 31 corresponds to FIG. 20 of the first embodiment.

Figure 27:
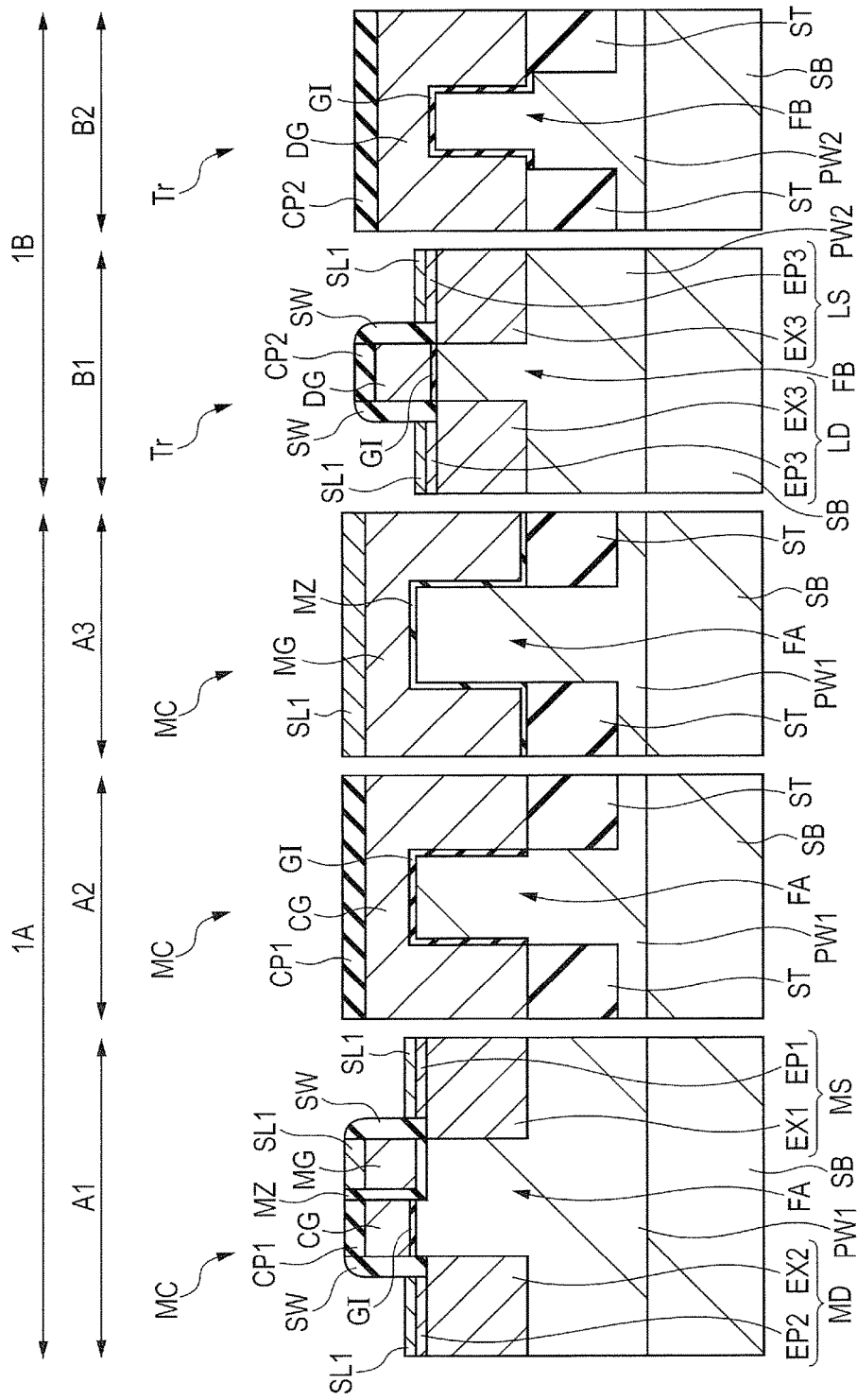
FIG. 27 is a major-part sectional view of the semiconductor device of the second embodiment during the manufacturing process, which corresponds to FIG. 14 of the first embodiment.

As shown in FIG. 25, a plurality of memory cells MC are disposed in a matrix in the memory cell region 1A, and a plurality of transistors Tr configuring a peripheral circuit (logic circuit) are disposed in the peripheral circuit region 1B. FIG. 25 shows only one of the transistors Tr. Although the transistor Tr includes an n type MISFET and a p type MISFET, the n type MISFET is illustrated herein. FIGS. 26 and 27 each show sectional views along A1-A1', along A2-A2', along A3-A3', along B1-B1', and along B2-B2' in FIG. 25. FIGS. 28 to 31 each show sectional views along A1-A1' and along B1-B1' in FIG. 25.

As shown in FIG. 25, a plurality of fins FA extending in the X direction are arranged at equal intervals in the Y direction in the memory cell region 1A. The fin FA is, for example, a protruding portion (protrusion) of a rectangular parallelepiped protruding selectively from the main surface of the semiconductor substrate SB, and a lower end portion of the fin FA is surrounded by the element isolation film ST covering the main surface of the semiconductor substrate SB. The fin FA, a part of the semiconductor substrate SB, serves as an active region of the semiconductor substrate SB. In planar view, therefore, a space between the adjacent fins FA is filled with the element isolation film ST, and the periphery of the fin FA is surrounded by the element isolation film ST. The fin FA serves as an active region for forming the memory cell MC.

A plurality of control gate electrodes CG and a plurality of memory gate electrodes MG extending in the Y direction (direction orthogonal to the X direction) are disposed on the fins FA. For example, a semiconductor region MD to be a drain is provided on a side close to the control gate electrode CG, and, for example, a semiconductor region MS to be a source is provided on a side close to the memory gate electrode MG such that the semiconductor regions MD and MS sandwich the control gate electrode CG and the memory gate electrode MG. The semiconductor regions MD and MS are each a semiconductor region formed by introducing an n type impurity into the fin FA, and the epitaxial layers EP2 and EP1 are provided along the respective peripheries of the fins FA. That is, the semiconductor region MD is an n type semiconductor region formed by introducing the n type impurity into the fin FA and the epitaxial layer EP2. The semiconductor region MS is an n type semiconductor region formed by introducing the n type impurity into the fin FA and the epitaxial layer EP1. The semiconductor region MD is provided between the two adjacent control gate electrodes CG. The semiconductor region MS is provided between the two adjacent memory gate electrodes MG. The memory cell MC includes the control gate electrode CG, the memory gate electrode MG, the semiconductor region MD, and the semiconductor region MS.

The two memory cells MC adjacent in the X direction share the semiconductor region MD or MS. The two memory cells MC sharing the semiconductor region MD are mirror symmetrical in the X direction with respect to the semiconductor region MD. Two memory cells MC sharing the semiconductor region MS are mirror symmetrical in the X direction with respect to the semiconductor region MS.

Each fin FA has three or more memory cells MC provided in the X direction. The semiconductor regions MD of the memory cells MC arranged in the X direction are coupled to the source line SL including the metal interconnection MW extending in the X direction via the plug electrodes PG formed in the contact holes CT. The semiconductor regions MS of the memory cells MC arranged in the Y direction are coupled to the bit line BL including the metal interconnection MW extending in the Y direction. A metal interconnection in a layer different from a layer of the bit line BL is preferably used for the source line SL. For example, the source line SL is preferably configured of a metal interconnection in a layer upper than the bit line BL.

For example, a fin FB extending in the X direction is provided in the peripheral circuit region 1B. The fin FB serves as an active region of the semiconductor substrate SB as with the fin FA. A lower end portion of the fin FB is surrounded by the element isolation film ST covering the main surface of the semiconductor substrate SB. The gate electrode GE extending in the Y direction is disposed on the fin FB. For example, a semiconductor region LD to be a drain and, for example, a semiconductor region LS to be a source are provided in the fin FB such that the semiconductor regions LD and LS sandwich the gate electrode GE. The semiconductor region LD and the semiconductor region LS are each a semiconductor region formed by introducing an n type impurity into the fin FB, and an epitaxial layer EP3 is provided along the periphery of the fin FB. That is, the semiconductor region LD and the semiconductor region LS are each an n type semiconductor region formed by introducing the n type impurity into the fin FB and the epitaxial layer EP3. The transistor Tr includes the gate electrode GE, the semiconductor region LD, and the semiconductor region LS. The gate electrode GE, the semiconductor region LD, and the semiconductor region LS are each coupled to the metal interconnection MW via the plug electrode PG formed in the contact hole CT. The fin FB serves as an active region for forming the transistor Tr.

The fins FA and FB are, for example, rectangular parallelepiped protrusions protruding from the main surface of the semiconductor substrate SB in a direction perpendicular to the main surface. The fins FA and FB each have an appropriate length in a long side direction, an appropriate width in a short side direction, and an appropriate height in a height direction. The fins FA and FB each do not necessarily have a rectangular parallelepiped shape but may have a rectangular shape having rounded corners in sectional view in the short side direction. The direction in which the fins FA and FB extend in planar view corresponds to the long-side direction, and the direction orthogonal to the long-side direction is the short side direction. In other words, the length is larger than the width. The fins FA and FB may each have any shape, as long as the fin is a protrusion having a length, a width, and a height. For example, the shape also includes a meandering pattern in planar view.

The semiconductor device of the second embodiment is also manufactured according to the manufacturing process of the process flow diagram shown in FIGS. 1 to 3.

FIG. 26 is a sectional view corresponding to FIG. 4 of the first embodiment, showing a state where Steps S1 and S2 of the process flow diagram of FIG. 1 are performed.

As shown in FIG. 26, the fins FA and FB are provided in the memory cell region 1A and the peripheral circuit region 1B, respectively. The fins FA and FB selectively protrude from the main surface of the semiconductor substrate SB through the element isolation film ST.

Subsequently, Step S3 of FIG. 1 to Step S18 of FIG. 2 are performed to produce a structure shown in FIG. 27. The structure is different from the structure of the first embodiment in the following points. In the memory cell region 1A, the insulating film GI, the control gate electrode CG, the insulating film MZ, and the memory gate electrode MG are each provided along the top and the side faces of the fin FA. In the peripheral circuit region 1B, the insulating film GI and the gate electrode DG are each provided along the top and the side faces of the fin FB. The respective semiconductor regions MS and MD are configured of the n⁻ type semiconductor regions EX1 and EX2 and the epitaxial layers EP1 and EP2 being n⁺ type semiconductor regions. The semiconductor regions LS and LD are each configured of the n⁻ type semiconductor region EX3 and the epitaxial layer EP3 being an n⁺ type semiconductor region.

Figure 28:
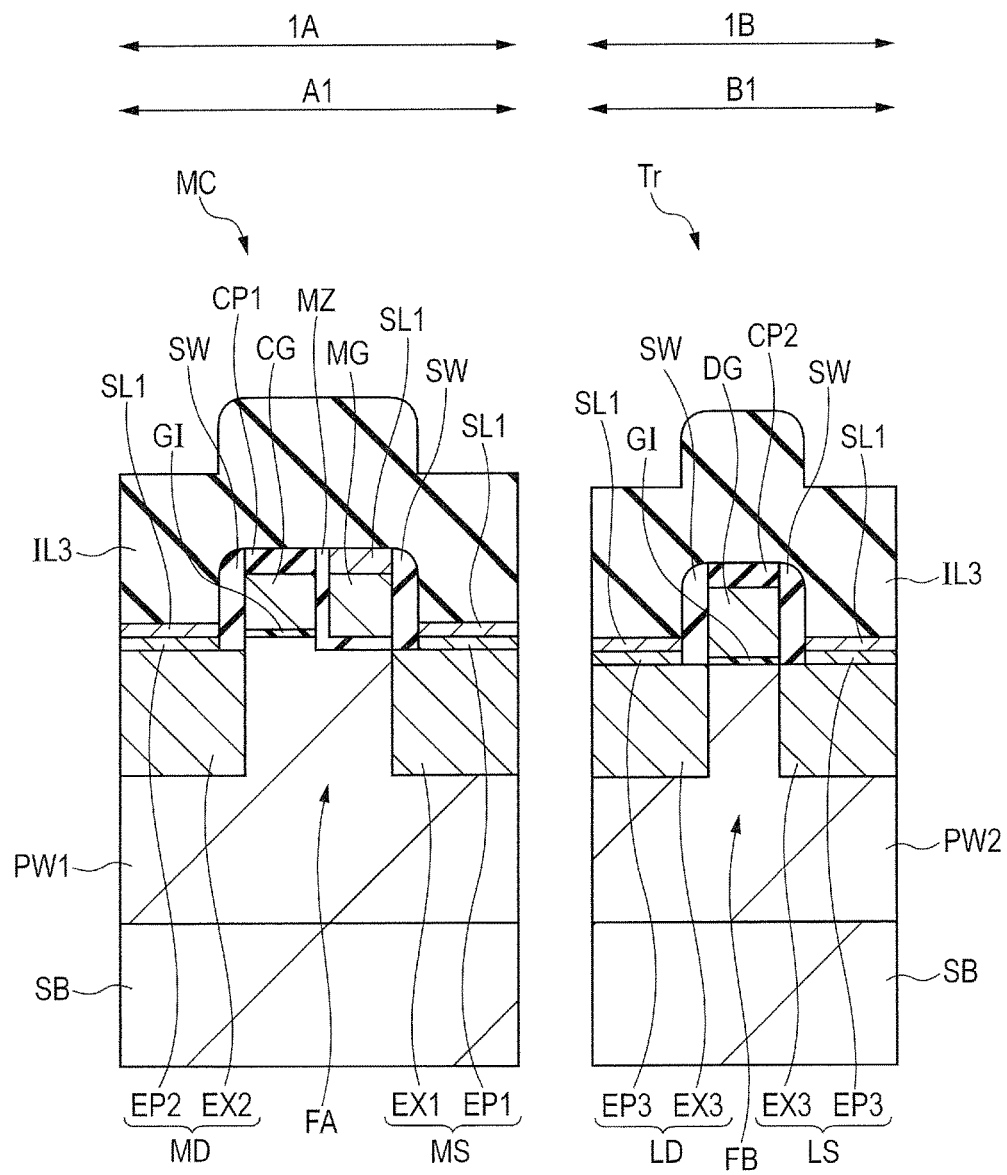
FIG. 28 is a major-part sectional view of the semiconductor device of the second embodiment during the manufacturing process, which corresponds to FIG. 15 of the first embodiment.

Subsequently, as shown in FIG. 28, Step S19 of FIG. 2 is performed. FIG. 28 corresponds to FIG. 15 of the first embodiment, showing that Step S19 is performed as in the first embodiment. Specifically, the insulating film IL3 is an $O_3$-TEOS film, and is subjected to heat treatment in an oxidizing atmosphere before the polishing step (Step S20) of FIG. 2.

Figure 29:
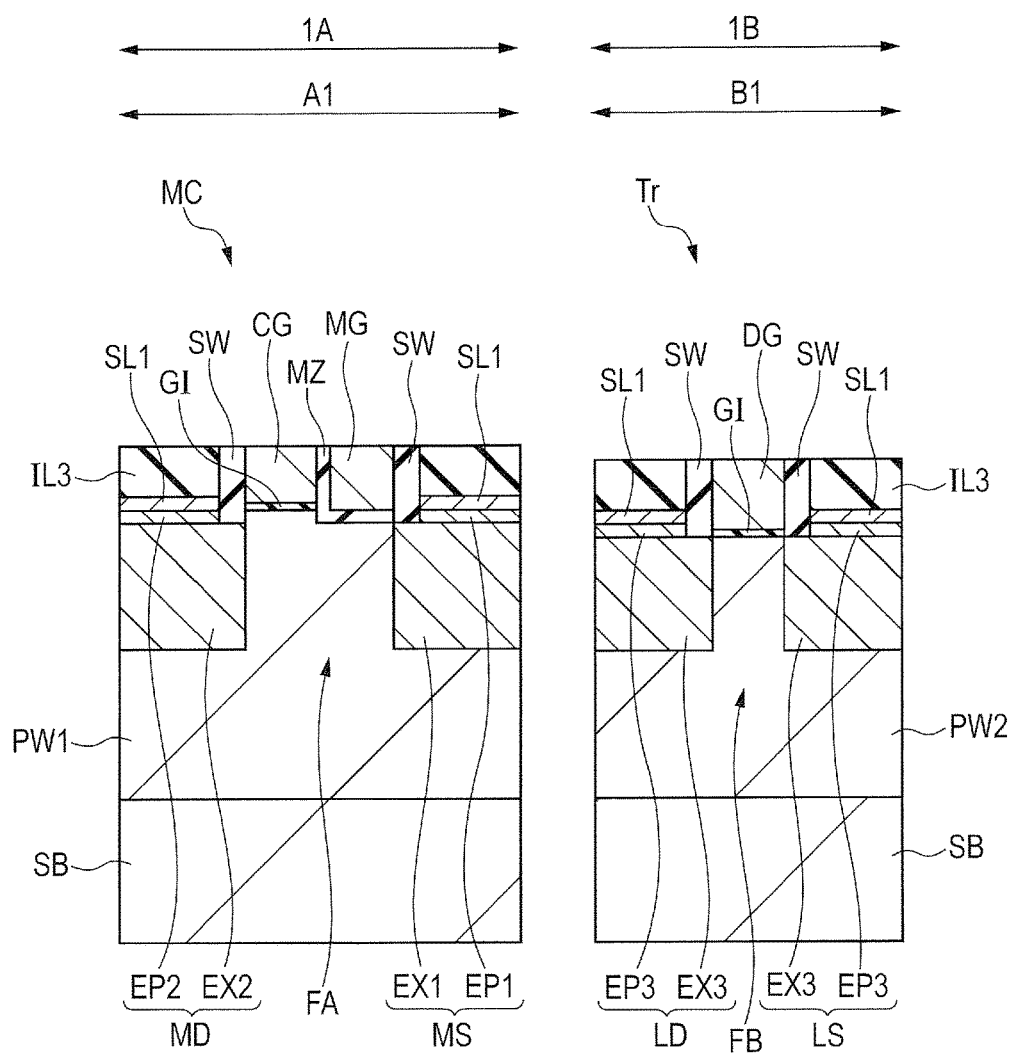
FIG. 29 is a major-part sectional view of the semiconductor device of the second embodiment during the manufacturing process, which corresponds to FIG. 16 of the first embodiment.

Subsequently, as shown in FIG. 29, Step S20 of FIG. 2 is performed. FIG. 29 corresponds to FIG. 15 of the first embodiment, showing that Step S20 is performed as in the first embodiment.

Figure 30:
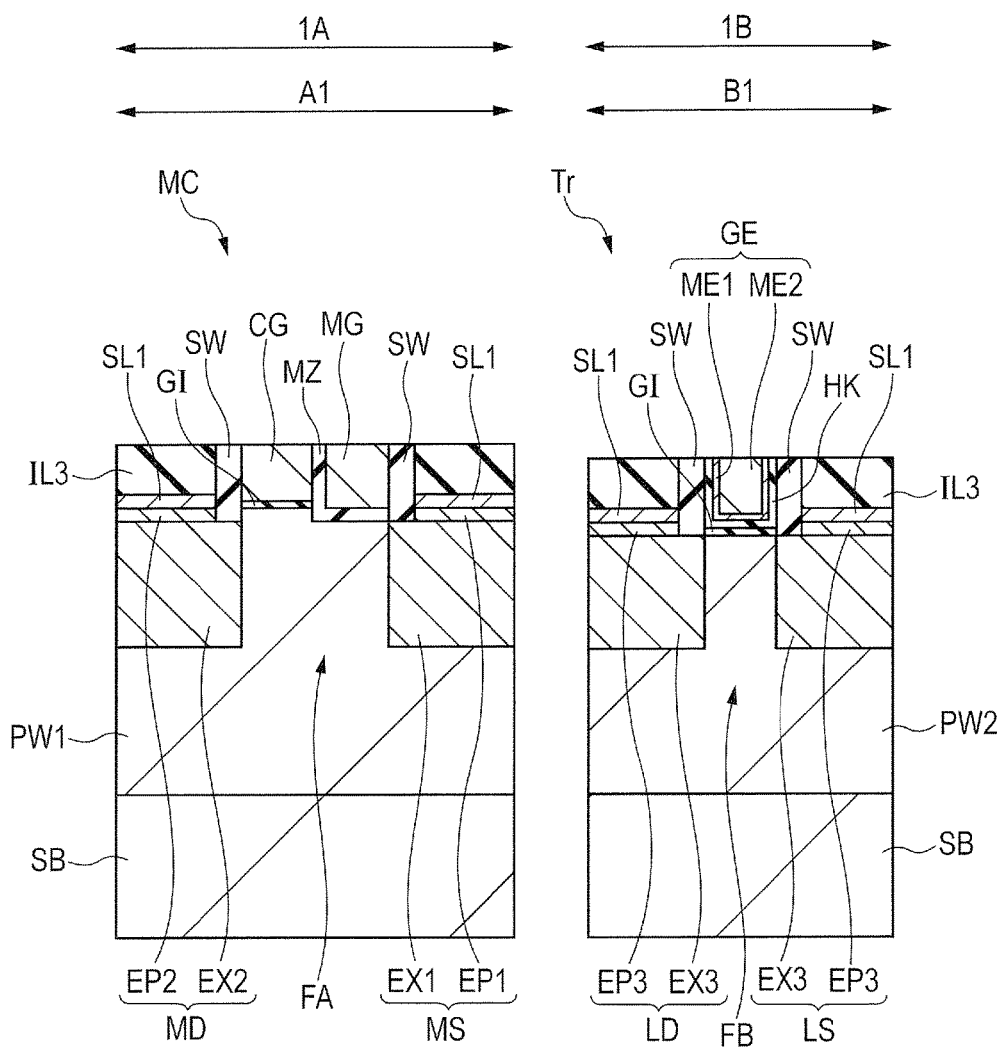
FIG. 30 is a major-part sectional view of the semiconductor device of the second embodiment during the manufacturing process, which corresponds to FIG. 19 of the first embodiment.

Subsequently, as shown in FIG. 30, Steps S21 to S25 of FIG. 3 are performed. FIG. 30 corresponds to FIG. 19 of the first embodiment, showing that Steps S20 to S25 are performed as in the first embodiment.

Figure 31:
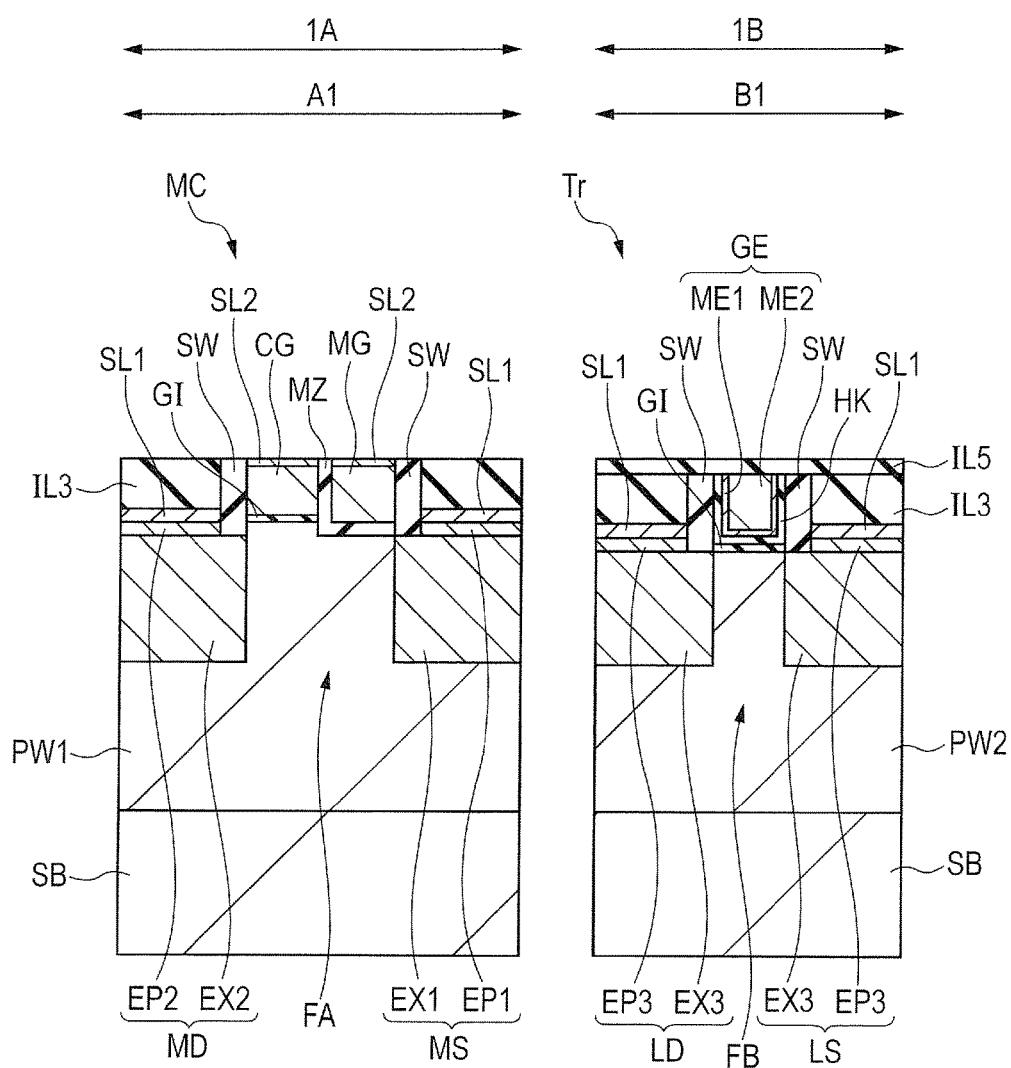
FIG. 31 is a major-part sectional view of the semiconductor device of the second embodiment during the manufacturing process, which corresponds to FIG. 20 of the first embodiment.

Subsequently, as shown in FIG. 31, Steps S26 to S27 of FIG. 3 are performed. FIG. 31 corresponds to FIG. 20 of the first embodiment, showing that Steps S26 to S27 are performed as in the first embodiment.

Although not shown, Steps S28 to 31 of FIG. 3 are further performed to form the semiconductor device of the second embodiment.

The second embodiment can also provide effects similar to those in the first embodiment.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A method of manufacturing a semiconductor device, comprising the steps of:
   (a) providing a semiconductor substrate having a memory cell region and a peripheral circuit region in a main surface of the semiconductor substrate;
   (b) in the memory cell region, forming a memory cell including: a first gate electrode formed over the main surface of the semiconductor substrate with a first gate insulating film in between; a second gate electrode formed adjacent to the first gate electrode over the main surface of the semiconductor substrate with a second gate insulating film in between, the second gate insulating film including a charge accumulating region; and a first source region and a first drain region formed in the main surface of the semiconductor substrate so as to sandwich the first gate electrode and the second gate electrode, and in the peripheral circuit region, forming a MISFET including: a third gate electrode formed over the main surface of the semiconductor substrate with a third gate insulating film in between; and a second source region and a second drain region formed over the main surface of the semiconductor substrate so as to sandwich the third gate electrode;
   (c) forming a first insulating film including an O3-TEOS film formed at a first temperature over the main surface of the semiconductor substrate so as to cover the memory cell and the MISFET;
   (d) performing heat treatment on the first insulating film at a second temperature in an oxidizing atmosphere;
   (e) after the step (d), performing first polishing on the first insulating film to expose tops of the first gate electrode, the second gate electrode, and the third gate electrode;
   (f) in the peripheral circuit region, removing the third gate electrode to form a trench in the first insulating film;
   (g) forming a metal film over the first insulating film so as to fill the trench;
   (h) performing second polishing on the metal film to selectively leave the metal film in the trench, thereby forming a fourth gate electrode of the MISFET in the trench,
   wherein the second temperature is lower than the first temperature.

2. The method according to claim 1,
   wherein in the step (f), the third gate electrode is removed by a wet etching process, and
   wherein wet etching rate of the first insulating film after the heat treatment is lower than wet etching rate of the first insulating film before the heat treatment.

3. The method according to claim 2, wherein the third gate electrode includes a polycrystalline silicon film.

4. The method according to claim 1, further comprising the step of, between the step (b) and the step (c),
   (i) forming a first silicide layer over tops of the first source region, the first drain region, the second source region, and the second drain region.

5. The method according to claim 4, wherein the first silicide layer contains Ni.

6. The method according to claim 1, wherein the oxidizing atmosphere includes one of O2, O3, H2O, and H2O2.

7. The method according to claim 1, wherein the O3-TEOS film in the step (c) has a ratio of silanol (Si—O—H) groups to siloxane (Si—O—Si) groups of 10% or more.

8. The method according to claim 1, wherein a relative dielectric constant of the first insulating film after the heat treatment is lower than a relative dielectric constant of the first insulating film before the heat treatment.

9. The method according to claim 1, further comprising the step of, after the step (h),
   (j) forming a second silicide layer over the tops of the first gate electrode and the second gate electrode.

10. The method according to claim 1, further comprising the steps of:
    after the step (h),
    (k) forming a second insulating film over the first insulating film so as to cover the first gate electrode, the second gate electrode, and the fourth gate electrode;
    (l) forming a contact hole penetrating through the second insulating film and the first insulating film to expose a top of one of the first source region and the first drain region; and
    (m) forming a plug electrode in the contact hole.

11. The method according to claim 1,
    wherein in the step (b), a sidewall spacer including an insulating film is formed over a sidewall of each of the first gate electrode, the second gate electrode, and the third gate electrode, and
    wherein, in the step (f), the sidewall spacer is exposed on a side face of the trench.

12. A method of manufacturing a semiconductor device, comprising the steps of:

(a) providing a semiconductor substrate that has a memory cell region and a peripheral circuit region in a main surface of the semiconductor substrate, and includes a first protrusion protruding from the main surface through an element isolation film and a second protrusion protruding from the main surface through the element isolation film;

(b) in the memory cell region, forming a memory cell including: a first gate electrode formed over the first protrusion with a first gate insulating film in between; a second gate electrode formed adjacent to the first gate electrode over the first protrusion with a second gate insulating film in between, the second gate insulating film including a charge accumulating region; and a first source region and a first drain region formed over the first protrusion so as to sandwich the first gate electrode and the second gate electrode, and in the peripheral circuit region, forming a MISFET including: a third gate electrode formed over the second protrusion with a third gate insulating film in between; and a second source region and a second drain region formed over the second protrusion so as to sandwich the third gate electrode;

(c) forming a first insulating film including an O3-TEOS film formed at a first temperature over the semiconductor substrate so as to cover the memory cell and the MISFET;

(d) performing heat treatment on the first insulating film at a second temperature in an oxidizing atmosphere;

(e) after the step (d), performing first polishing on the first insulating film to expose tops of the first gate electrode, the second gate electrode, and the third gate electrode;

(f) in the peripheral circuit region, removing the third gate electrode to form a trench in the first insulating film;

(g) forming a metal film over the first insulating film so as to fill the trench; and (h) performing second polishing on the metal film to selectively leave the metal film in the trench, thereby forming a fourth gate electrode of the MISFET in the trench, wherein the second temperature is lower than the first temperature.

13. The method according to claim 12, wherein the oxidizing atmosphere includes one of O2, O3, H2O, and H2O2.

14. The method according to claim 12, wherein the O3-TEOS film in the step (c) has a ratio of silanol (Si—O—H) groups to siloxane (Si—O—Si) groups of 10% or more.

* * * * *